United States Patent
Kubota et al.

(10) Patent No.: US 9,082,975 B2
(45) Date of Patent: Jul. 14, 2015

(54) PIEZOELECTRIC MATERIAL AND DEVICES USING THE SAME

(75) Inventors: Makoto Kubota, Yokohama (JP); Kaoru Miura, Matsudo (JP); Hisato Yabuta, Machida (JP); Takayuki Watanabe, Yokohama (JP); Jumpei Hayashi, Chofu (JP); Hiroshi Funakubo, Yokohama (JP); Tomoaki Yamada, Yokohama (JP); Shintaro Yasui, Yokohama (JP); Keisuke Yazawa, Yokohama (JP); Hiroshi Uchida, Tokyo (JP); Jun-ichi Nagata, Yokohama (JP)

(73) Assignees: Canon Kabushiki Kaisha, Tokyo (JP); Tokyo Institute of Technology, Tokyo (JP); Sophia School Corporation, Tokyo (JP)

( * ) Notice: Subject to any disclaimer, the term of this patent is extended or adjusted under 35 U.S.C. 154(b) by 302 days.

(21) Appl. No.: 13/580,061

(22) PCT Filed: Feb. 28, 2011

(86) PCT No.: PCT/JP2011/055154
§ 371 (c)(1),
(2), (4) Date: Nov. 5, 2012

(87) PCT Pub. No.: WO2011/111643
PCT Pub. Date: Sep. 15, 2011

(65) Prior Publication Data
US 2013/0127298 A1 May 23, 2013

(30) Foreign Application Priority Data

Mar. 2, 2010 (JP) ................. 2010-045908
Sep. 13, 2010 (JP) ................. 2010-204420
Dec. 28, 2010 (JP) ................. 2010-292850

(51) Int. Cl.
H01L 41/187 (2006.01)
H01L 41/18 (2006.01)
(Continued)

(52) U.S. Cl.
CPC ................ *H01L 41/18* (2013.01); *C04B 35/01* (2013.01); *C04B 35/016* (2013.01);
(Continued)

(58) Field of Classification Search
USPC ........... 310/358, 311, 365, 357; 252/62.9 PZ, 252/62.9 R; 501/134, 135, 136
See application file for complete search history.

(56) References Cited

U.S. PATENT DOCUMENTS 7,399,067 B2   7/2008  Kubota et al.
7,453,188 B2  11/2008  Matsuda et al.
(Continued)

FOREIGN PATENT DOCUMENTS

CN   1258557 A     7/2000
EP   2 145 975 A2  1/2010
JP   2007-287739 A 11/2007

OTHER PUBLICATIONS

Office Action in Chinese Application No. 201180021963.4 (issued Mar. 20, 2014).
(Continued)

*Primary Examiner* — Thomas Dougherty
*Assistant Examiner* — Karen B Addison
(74) *Attorney, Agent, or Firm* — Fitzpatrick, Cella, Harper & Scinto

(57) ABSTRACT

Provided is a Bi-based piezoelectric material having good piezoelectric properties. The piezoelectric material includes a perovskite-type metal oxide represented by the following general formula (1):

$$A_x(Zn_jTi_{(1-j)})_l(Mg_kTi_{(1-k)})_m M_n O_3 \quad \text{General formula (1)}$$

where: A represents a Bi element, or one or more kinds of elements selected from the group consisting of trivalent metal elements and containing at least a Bi element; M represents at least one kind of an element selected from the group consisting of Fe, Al, Sc, Mn, Y, Ga, and Yb; and $0.9 \leq x \leq 1.25$, $0.4 \leq j \leq 0.6$, $0.4 \leq k \leq 0.6$, $0.09 \leq l \leq 0.49$, $0.19 \leq m \leq 0.64$, $0.13 \leq n \leq 0.48$, and $l+m+n=1$ are satisfied.

17 Claims, 5 Drawing Sheets

(51) Int. Cl.
  C04B 35/01   (2006.01)
  C04B 35/26   (2006.01)
  C04B 35/44   (2006.01)
  C04B 35/453  (2006.01)
  C04B 35/475  (2006.01)
  C04B 35/632  (2006.01)
  H01L 41/08   (2006.01)
  H01L 41/09   (2006.01)
  H02N 2/10    (2006.01)
  H02N 2/16    (2006.01)
  H01L 41/316  (2013.01)
  H01L 41/318  (2013.01)

(52) U.S. Cl.
  CPC ........... *C04B 35/2625* (2013.01); *C04B 35/44* (2013.01); *C04B 35/453* (2013.01); *C04B 35/475* (2013.01); *C04B 35/6325* (2013.01); *H01L 41/0805* (2013.01); *H01L 41/0973* (2013.01); *H01L 41/1878* (2013.01); *H02N 2/106* (2013.01); *H02N 2/163* (2013.01); C04B 2235/3206 (2013.01); C04B 2235/3217 (2013.01); C04B 2235/3224 (2013.01); C04B 2235/3225 (2013.01); C04B 2235/3227 (2013.01); C04B 2235/3232 (2013.01); C04B 2235/3267 (2013.01); C04B 2235/3272 (2013.01); C04B 2235/3284 (2013.01); C04B 2235/3286 (2013.01); C04B 2235/3298 (2013.01); C04B 2235/449 (2013.01); C04B 2235/76 (2013.01); C04B 2235/765 (2013.01); C04B 2235/768 (2013.01); C04B 2235/787 (2013.01); *H01L 41/316* (2013.01); *H01L 41/318* (2013.01)

(56) References Cited

U.S. PATENT DOCUMENTS

| | | |
|---|---|---|
| 7,591,543 B2 | 9/2009 | Aoki et al. |
| 2005/0218466 A1* | 10/2005 | Kondo et al. ............... 257/416 |
| 2005/0219793 A1 | 10/2005 | Matsuda et al. |
| 2007/0097182 A1* | 5/2007 | Kubota et al. ............... 347/70 |
| 2008/0067898 A1 | 3/2008 | Aoki et al. |
| 2008/0089832 A1 | 4/2008 | Aoki et al. |
| 2010/0025617 A1 | 2/2010 | Kubota et al. |
| 2011/0268965 A1 | 11/2011 | Kubota et al. |
| 2013/0222482 A1* | 8/2013 | Kubota et al. ............... 310/358 |

OTHER PUBLICATIONS

Joel Zylberberg et al., "Bismuth Aluminate: A New High-Tc Lead-Free Piezo-/ferroelectric," 19 Chem. Mater. 6385-6390 (Nov. 2007).

Chien-Chih Huang et al., "Phase Transitions and Ferroelectric Properties in $BiScO_3$-$Bi(Zn_{1/2}Ti_{1/2})O_3$-$BaTiO_3$ Solid Solutions," 102 J. Appl. Phys. 044103: 1-5 (Aug. 2007) (X012101548).

Matthew R. Suchomel et al., "$Bi_2ZnTiO_6$: A Lead-Free Closed-Shell Polar Perovskite with a Calculated Ionic Polarization of 150 μC cm-2," 18 Chem. Mater. 4987-4989 (Sep. 2006).

Office Action in U.S. Appl. No. 13/770,250 (mailed Oct. 1, 2014).

* cited by examiner

A: (l, m, n)=(0.45, 0.19, 0.36)
B: (l, m, n)=(0.27, 0.37, 0.36)
C: (l, m, n)=(0.27, 0.46, 0.27)
D: (l, m, n)=(0.49, 0.24, 0.27)
J: (l, m, n)=(0.49, 0.19, 0.32)

PIEZOELECTRIC MATERIAL AND DEVICES USING THE SAME

TECHNICAL FIELD

The present invention relates to a piezoelectric material, a piezoelectric element, a liquid discharge head, and an ultrasonic motor, in particular, a novel piezoelectric material formed of a metal oxide free of lead.

BACKGROUND ART

A piezoelectric element is typically formed of a bulk-shaped or film-shaped piezoelectric material including a lower electrode and an upper electrode.

As a piezoelectric material, $ABO_3$ type ceramics such as lead zirconate titanate (hereinafter, referred to as "PZT") is generally used.

However, PZT contains lead at an A-site of a perovskite skeleton. Therefore, the environmental impact of the lead component is considered to be a problem. In order to address this problem, a piezoelectric material using a lead-free perovskite-type metal oxide has been proposed.

For example, as a piezoelectric material formed of a lead-free perovskite-type oxide, "Chemistry of Materials" 2006, Vol. 18, No. 21, pp. 4987-4989 describes $Bi(Zn_{0.5}Ti_{0.5})O_3$. However, although the $Bi(Zn_{0.5}Ti_{0.5})O_3$ is theoretically expected to have excellent piezoelectric performance, it is difficult to polarize the $Bi(Zn_{0.5}Ti_{0.5})O_3$ due to its high Curie temperature, and hence the piezoelectric performance thereof has not been clarified.

Further, a piezoelectric material containing $BiFeO_3$ as a main component has been proposed. For example, Japanese Patent Application Laid-open No. 2007-287739 discloses a $BiFeO_3$-based material containing La in an A-site. $BiFeO_3$ is a satisfactory ferroelectric substance, and is reported to exhibit a high remanent polarization value at low temperatures. However, there remains a problem that sufficient piezoelectric strain cannot be obtained from $BiFeO_3$.

Further, "Chemistry of Materials" 2007, Vol. 19, No. 26, pp. 6385-6390 discloses a $BiAlO_3$ piezoelectric material obtained by a high-pressure synthesis method. However, the piezoelectric performance of $BiAlO_3$ has also not reached a practically applicable range yet.

The present invention has been accomplished to cope with such problems, and an object of the present invention is to provide a piezoelectric material having good piezoelectricity, and a piezoelectric element, a liquid discharge head, and an ultrasonic motor each using the piezoelectric material.

A first piezoelectric material of the present invention that solves the above-mentioned problems includes a perovskite-type metal oxide represented by the following general formula (1):

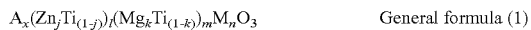

General formula (1)

where: A represents a Bi element, or one or more kinds of elements selected from the group consisting of trivalent metal elements and containing at least a Bi element; M represents at least one kind of an element selected from the group consisting of Fe, Al, Sc, Mn, Y, Ga, and Yb; and $0.9 \le x \le 1.25$, $0.4 \le j \le 0.6$, $0.4 \le k \le 0.6$, $0.27 \le l \le 0.49$, $0.19 \le m \le 0.46$, $0.27 \le n \le 0.36$, and $l+m+n=1$ are satisfied.

A second piezoelectric material of the present invention that solves the above-mentioned problems includes a perovskite-type metal oxide represented by the following general formula (1):

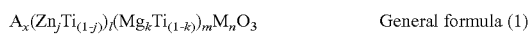

General formula (1)

where: A represents a Bi element, or one or more kinds of elements selected from the group consisting of trivalent metal elements and containing at least a Bi element; M represents at least one kind of an element selected from the group consisting of Fe, Al, Sc, Mn, Y, Ga, and Yb; $0.9 \le x \le 1.25$, $0.4 \le j \le 0.6$, and $0.4 \le k \le 0.6$ are satisfied; and $l+m+n=1$ is satisfied, and l, m, and n fall within a range surrounded by coordinate points A, B, C, D, E, F, G, H, I, and A, provided that the coordinate points A, B, C, and D, a line connecting the coordinate points A and B, a line connecting the coordinate points B and C, and a line connecting the coordinate points C and D are not contained in the above-mentioned range.

A: (l, m, n)=(0.45, 0.19, 0.36)
B: (l, m, n)=(0.27, 0.37, 0.36)
C: (l, m, n)=(0.27, 0.46, 0.27)
D: (l, m, n)=(0.49, 0.24, 0.27)
E: (l, m, n)=(0.35, 0.52, 0.13)
F: (l, m, n)=(0.23, 0.64, 0.13)
G: (l, m, n)=(0.09, 0.64, 0.27)
H: (l, m, n)=(0.09, 0.43, 0.48)
I: (l, m, n)=(0.33, 0.19, 0.48)

A piezoelectric element of the present invention that solves the above-mentioned problems is a piezoelectric element including at least a piezoelectric material and a pair of electrodes provided in contact with the piezoelectric material in which the piezoelectric material is the above-mentioned piezoelectric material.

In a liquid discharge head of the present invention that solves the above-mentioned problems, the above-mentioned piezoelectric element is used. In an ultrasonic motor of the present invention that solves the above-mentioned problems, the above-mentioned piezoelectric element is used.

According to the present invention, there can be provided the piezoelectric material having good piezoelectricity, and the piezoelectric element, the liquid discharge head, and the ultrasonic motor each using the piezoelectric material.

Further, the piezoelectric material of the present invention does not affect an environment because the material does not use lead. In addition, the material is advantageous in terms of durability when used in a piezoelectric element because the material does not use any alkali metal.

Further features of the present invention will become apparent from the following description of exemplary embodiments with reference to the attached drawings.

DESCRIPTION OF EMBODIMENTS

Hereinafter, a mode for carrying out the present invention is described.

The present invention provides a novel piezoelectric material based on a Bi-based piezoelectric material and having good piezoelectric property. It should be noted that the piezoelectric material of the present invention can find use in a variety of applications such as a capacitor material, a memory material, and a sensor material by utilizing its properties as a dielectric substance.

A first piezoelectric material according to the present invention includes a perovskite-type metal oxide represented by the following general formula (1).

$$A_x(Zn_jTi_{(1-j)})_l(Mg_kTi_{(1-k)})_m M_n O_3 \qquad \text{General formula (1)}$$

In the above-mentioned general formula (1), A represents a Bi element, or one or more kinds of elements selected from the group consisting of trivalent metal elements and containing at least a Bi element; M represents at least one kind of an element selected from the group consisting of Fe, Al, Sc, Mn, Y, Ga, and Yb; and $0.9 \le x \le 1.25$, $0.4 \le j \le 0.6$, $0.4 \le k \le 0.6$, and $l+m+n=1$ are satisfied.

In the first piezoelectric material of the present invention, l, m, and n in the above-mentioned general formula (1) satisfy the relationships of $0.27 \le l \le 0.49$, $0.19 \le m \le 0.46$, and $0.27 \le n \le 0.36$.

The foregoing can translate into the fact that l, m, and n fall within the range surrounded by coordinate points A, B, C, D, J, and A. It should be noted that lines connecting the respective coordinate points are included in the above-mentioned range.

Specific values for l, m, and n of each coordinate point are as described below.
A: (l, m, n)=(0.45, 0.19, 0.36)
B: (l, m, n)=(0.27, 0.37, 0.36)
C: (l, m, n)=(0.27, 0.46, 0.27)
D: (l, m, n)=(0.49, 0.24, 0.27)
J: (l, m, n)=(0.49, 0.19, 0.32)

Figure 5:
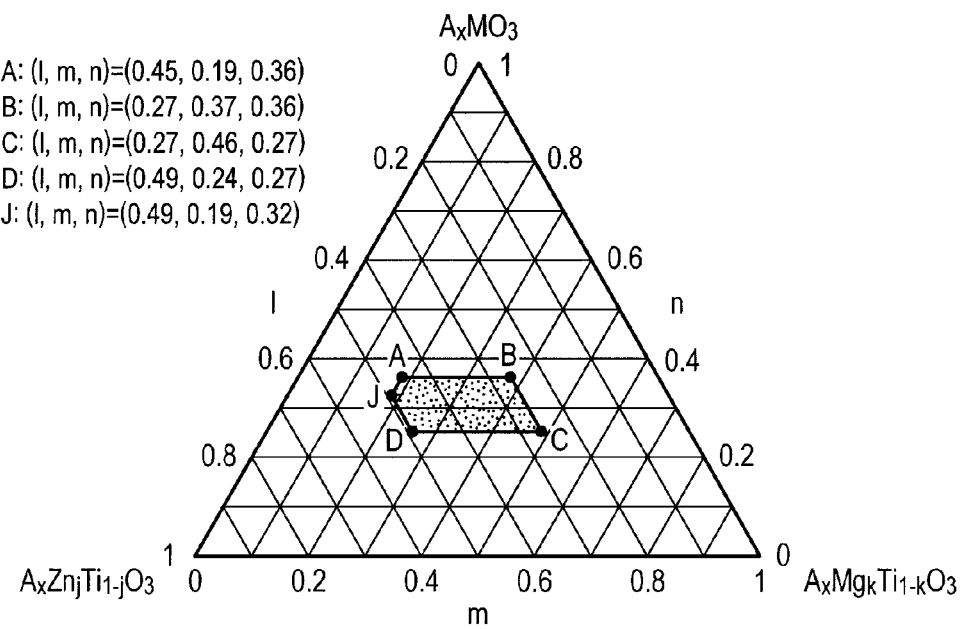
FIG. 5 is a ternary phase diagram illustrating the compositional range of a first piezoelectric material of the present invention.

FIG. 5 is a ternary phase diagram schematically illustrating the compositional range of the first piezoelectric material of the present invention. A colored portion surrounded by the coordinate points A, B, C, D, J, and A is the compositional range of the first piezoelectric material of the present invention, and hence the material shows excellent piezoelectric property. Filled circles and solid lines mean that the circles and the lines are included in the compositional range.

In addition, in a second piezoelectric material of the present invention, l, m, and n in the above-mentioned general formula (1) fall within the range surrounded by coordinate points A, B, C, D, E, F, G, H, I, and A, provided that the coordinate points A, B, C, and D, a line connecting the coordinate points A and B, a line connecting the coordinate points B and C, and a line connecting the coordinate points C and D are not included in the above-mentioned range and that the coordinate points E, F, G, H, and I, a line connecting the coordinate points D and E, a line connecting the coordinate points E and F, a line connecting the coordinate points F and G, a line connecting the coordinate points G and H, a line connecting the coordinate points H and I, and a line connecting the coordinate points I and A are included in the above-mentioned range.

Specific values for l, m, and n of each coordinate point are as described below.
A: (l, m, n)=(0.45, 0.19, 0.36)
B: (l, m, n)=(0.27, 0.37, 0.36)
C: (l, m, n)=(0.27, 0.46, 0.27)
D: (l, m, n)=(0.49, 0.24, 0.27)
E: (l, m, n)=(0.35, 0.52, 0.13)
F: (l, m, n)=(0.23, 0.64, 0.13)
G: (l, m, n)=(0.09, 0.64, 0.27)
H: (l, m, n)=(0.09, 0.43, 0.48)
I: (l, m, n)=(0.33, 0.19, 0.48)

Figure 6:
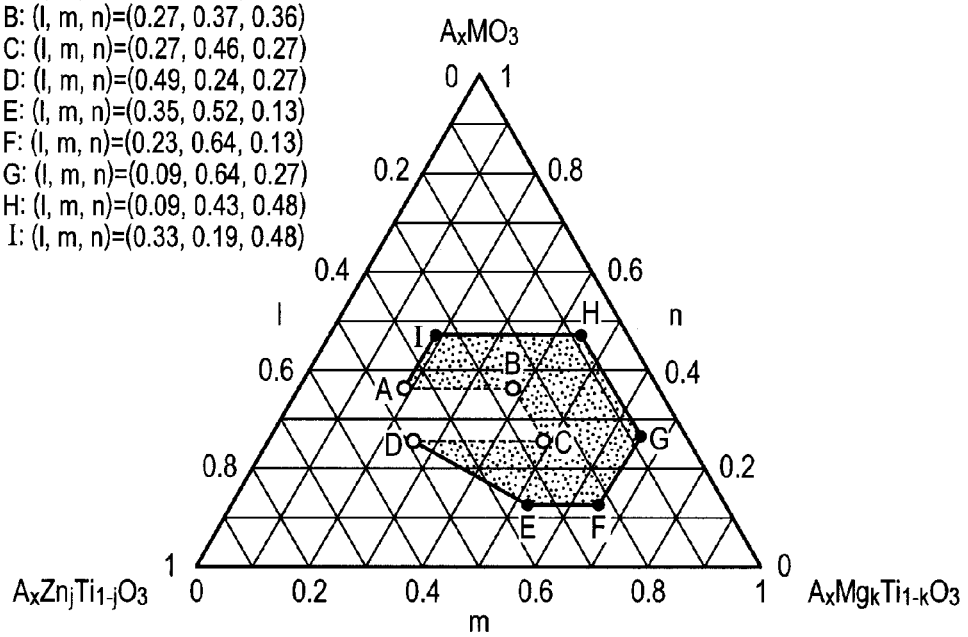
FIG. 6 is a ternary phase diagram illustrating the compositional range of a second piezoelectric material of the present invention.

FIG. 6 is a ternary phase diagram schematically illustrating the compositional range of the second piezoelectric material of the present invention. A colored portion surrounded by the coordinate points A, B, C, D, E, F, G, H, I, and A is the compositional range of the second piezoelectric material of the present invention, and hence the material shows excellent piezoelectric property. Filled circles and solid lines mean that the circles and the lines are included in the compositional range. On the other hand, unfilled circles and dotted lines mean that the circles and the lines are not included in the compositional range.

Figure 7:
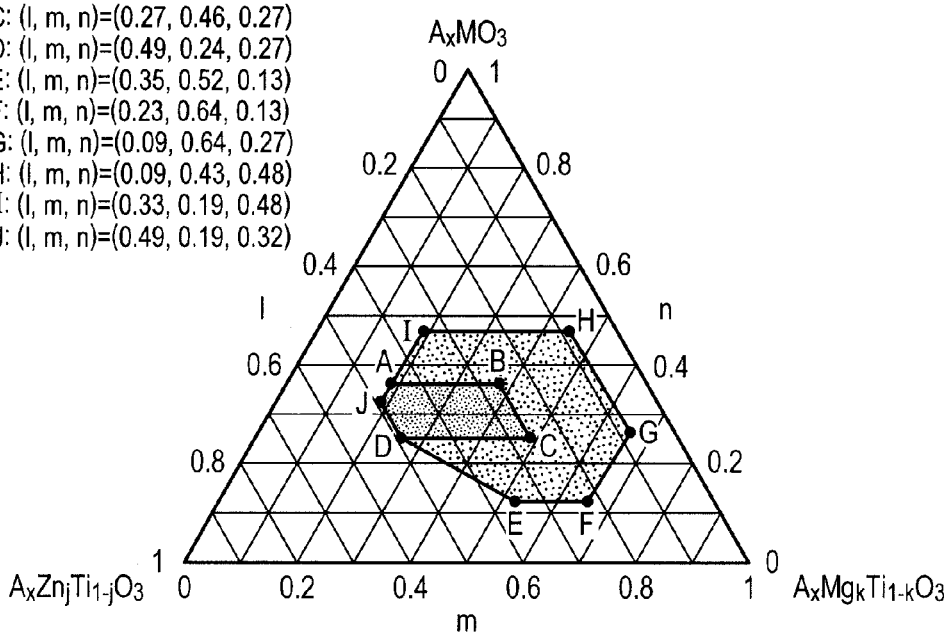
FIG. 7 is a ternary phase diagram illustrating the compositional ranges of the first and second piezoelectric materials of the present invention.

FIG. 7 is a ternary phase diagram schematically illustrating the compositional range of the first piezoelectric material of the present invention and the compositional range of the second piezoelectric material of the present invention together. A colored portion surrounded by the coordinates D, E, F, G, H, I, J, and D is the compositional ranges of the piezoelectric materials of the present invention, and hence the materials show excellent piezoelectric properties. Filled circles and solid lines mean that the circles and the lines are included in the compositional ranges.

Hereinafter, the first piezoelectric material and second piezoelectric material of the present invention are described together on the basis of FIG. 7.

The term "perovskite-type metal oxide" as used in the present invention refers to a metal oxide having a perovskite-type structure, which is ideally a cubic structure, as described in Iwanami Dictionary of Physics and Chemistry, 5th Edition (Iwanami Shoten, Publishers, Feb. 20, 1998). The metal oxide having the perovskite-type structure is generally represented by the chemical formula $ABO_3$. The elements A and B in the perovskite-type oxide each act in the form of an ion and occupy specific positions of a crystal unit cell called A-site and B-site, respectively. In a crystal unit cell of a cubic crystal system, for example, the element A is positioned at a vertex of a cube and the element B is positioned at the body center of the cube. The elements O act as oxygen anions and occupy face-centered positions.

The metal oxide represented by the general formula (1) refers to a solid solution of three kinds of perovskite-type metal oxides represented by $A(Zn_jTi_{(1-j)})O_3$, $A(Mg_kTi_{(1-k)})O_3$, and $AMO_3$. Upon description of a component of each solid solution in the description, the component is described by omitting the subscript x representing the degree of excess or insufficiency of A. In the general formula (1), A is a metal element positioned mainly at the A site of the perovskite-type structure, and $(Zn_jTi_{(1-j)})$, $(Mg_kTi_{(1-k)})$, and M are each an element positioned mainly at the B site of the structure.

In the general formula (1), A is formed of a Bi element alone, or one or more kinds of elements selected from trivalent metal elements and containing at least a Bi element. In this case, the $A(Zn_jTi_{(1-j)})O_3$ single substance adopts a tetragonal structure having a large aspect ratio, and the $A(Mg_kTi$ $_{(1-k)}O_3$ single substance adopts an orthorhombic structure serving as a non-tetragonal structure. It should be noted that the aspect ratio represents the magnitude of the shape anisotropy of a unit cell and the aspect ratio of the tetragonal structure represents a ratio c/a of the length of the c-axis of a unit cell to the length of the a-axis of the unit cell.

In the general formula (1), x representing the composition of an A-site element satisfies the relationship of $0.9 \le x \le 1.25$, preferably $0.98 \le x \le 1.15$. When x equals 1, the A site and the B site are equal to each other in number of metals, and hence a piezoelectric material having good insulation property can be obtained. On the other hand, when x is smaller than 0.9, the insufficiency of the A-site element may be responsible for a defective site, thereby adversely affecting the insulation property. In contrast, when x is larger than 1.25, an oxide of the excessive A-site element precipitates on a crystal grain boundary, and hence the oxide may be responsible for a current leak at the time of the application of a high voltage.

In the general formula (1), j representing the ratio of Zn to Ti satisfies the relationship of $0.4 \le j \le 0.6$, preferably $0.45 \le j \le 0.55$. The most preferred value of j is 0.5. When Zn is present as a divalent cation and Ti is present as a tetravalent cation in a crystal lattice, as the balance of charge is good when j is 0.5, the insulation property of the entire oxide is enhanced. However, depending upon the kinds of the B-site element and a dopant, j may be changed in a range of 0.4 to 0.6 for the purpose of enhancing insulation property.

Similarly, in the general formula (1), k representing the ratio of Mg to Ti satisfies the relationship of $0.4 \le j \le 0.6$, preferably $0.45 \le k \le 0.55$. The most preferred value of k is 0.5. When Mg is present as a divalent cation and Ti is present as a tetravalent cation in a crystal lattice, as the balance of charge is good when k is 0.5, the insulation property of the entire oxide is enhanced. However, depending upon the kinds of the B-site element and a dopant, k may be changed in a range of 0.4 to 0.6 for the purpose of enhancing insulation property.

M is selected from any of Fe, Al, Sc, Mn, Y, Ga, and Yb in the general formula (1), or a combination thereof. More preferably, in the general formula (1), M is formed of at least one of Fe and Al, or both the elements. When the metal ion is selected as M, an $AMO_3$ single substance mainly adopts a rhombohedral structure, i.e., a non-tetragonal structure.

When $A(Zn_jTi_{(1-j)})O_3$ that is a tetragonal structure in a single substance and $AMO_3$ that is a non-tetragonal structure in a single substance are formed into a solid solution, the piezoelectric effect of the solid solution with respect to an external electric field increases. The foregoing results from the fact that a polarization moment in the (001)-axis direction of the tetragonal structure switches with a polarization moment in the (111)-axis direction of the rhombohedral structure. The same holds true for such a piezoelectric material that only one of a tetragonal structure and a rhombohedral structure is observed in a solid solution. For example, even in the case of a piezoelectric material formed of a single phase having only a perovskite-type tetragonal structure in a static state, the switching between the polarization moments is induced by an external electric field as long as the material is a solid solution with a piezoelectric metal oxide having a rhombohedral structure.

It should be noted that a solid solution of a tetragonal structure having a large aspect ratio and a rhombohedral structure has so large a difference in volume between their respective unit cells that an energy barrier to the switching is high. In view of the foregoing, in the present invention, the aspect ratio of the tetragonal structure is suppressed by solid-dissolving $A(Mg_kTi_{(1-k)})O_3$ in addition to a binary solid solution of $A(Zn_jTi_{(1-j)})O_3$ and $AMO_3$. As a result, the energy barrier to the switching between the rhombohedral structure and the tetragonal structure becomes small, and hence piezoelectricity is improved.

Mg is selected for suppressing the aspect ratio of the tetragonal structure of $A(Zn_jTi_{(1-j)})O_3$ because Mg is similar in ionic radius to Zn and its d orbital has a low electron density. Solid-dissolving $A(Mg_kTi_{(1-k)})O_3$ in $A(Zn_jTi_{(1-j)})O_3$ can suppress the aspect ratio while maintaining the tetragonal structure of $A(Zn_jTi_{(1-j)})O_3$.

In the general formula (1), m representing a molar ratio of $A(Mg_kTi_{(1-k)})O_3$ amount satisfies the relationship of $0.19 \le m \le 0.64$, preferably $0.28 \le m \le 0.64$. When m is smaller than 0.19, a suppressing effect on the aspect ratio cannot be obtained, and hence the piezoelectricity may be insufficient. In contrast, when m is larger than 0.64, the tetragonal structure of $A(Zn_jTi_{(1-j)})O_3$ cannot be exploited for the piezoelectricity in some cases. Setting m within the range of 0.19 or more and 0.64 or less establishes a balance between the amplitude of the switching between the polarization moments and the energy barrier, and hence the piezoelectricity can be improved most effectively.

In the general formula (1), l representing a molar ratio of $A(Zn_jTi_{(1-j)})O_3$ amount satisfies the relationship of $0.09 \le l \le 0.49$, preferably $0.09 \le l \le 0.36$, provided that, when n representing a molar ratio of $AMO_3$ amount represents a value "0.27-y" equal to or less than 0.27, an upper limit for l described above is "0.49-y" where y is a real number ranging from 0 or more to 0.14 or less. When l is smaller than 0.09, the tetragonal structure of $A(Zn_jTi_{(1-j)})O_3$ cannot be exploited for the piezoelectricity in some cases. In contrast, when l is larger than 0.49 or 0.49-y, stability as a metal oxide reduces, and hence a non-perovskite-type impurity phase such as a bismuth layer structure may appear.

A ratio between $A(Mg_kTi_{(1-k)})O_3$ amount and $A(Zn_jTi_{(1-j)})O_3$ amount can be represented by m/(l+m). When the ratio satisfies the relationship of $0.35 \le m/(l+m) \le 0.88$, preferably $0.49 \le m/(l+m) \le 0.86$, the piezoelectric material of the present invention has particularly large piezoelectric property.

In the general formula (1), n representing the molar ratio of $AMO_3$ amount satisfies the relationship of $0.13 \le n \le 0.48$, preferably $0.18 \le n \le 0.48$. Setting n within the range of 0.13 or more and 0.48 or less allows the entirety of the perovskite-type metal oxide of which the piezoelectric material is formed to adopt a tetragonal structure or a monoclinic structure, and hence large piezoelectricity can be obtained.

It is preferred that A in the general formula (1) contains only a Bi element, or a Bi element and at least one or more kinds of elements selected from trivalent lanthanoid.

When A is formed of only a trivalent Bi-based metal element, a perovskite skeleton formed of an A-site element and an O element becomes stable electrically.

When A is formed of only a Bi element, the symmetry of a perovskite skeleton formed of an A-site element and an O element increases, and hence the stability of a piezoelectric material with respect to the external stimulus is enhanced. Further, effects of raising the Curie temperature of the piezoelectric material and enlarging a fluctuation range of internal polarization due to the strong bonding peculiar to the Bi element are obtained.

In the case where the piezoelectric material is subjected to polarization treatment from outside, it is preferred that A also contains a trivalent lanthanoide element for the purpose of adjusting the Curie temperature. Further, when A contains a lanthanoide element, the piezoelectric material of the present invention can be more easily synthesized under ambient pressure.

Examples of the trivalent lanthanoide element include La, Ce, Pr, Tm, Yb, and Dy. Of those, an La element is most preferred out of the lanthanoide elements to be contained in A. An La element makes a homogeneous solid solution with other components, and hence a single phase of a perovskite-structure can be easily obtained.

When A contains at least Bi element and a lanthanoide element, such as an La element, the ratio of Bi occupying A is preferably 70 mol % or more and 99.9 mol % or less, particularly preferably 90 mol % or more and 99.9 mol % or less. When the ratio of Bi occupying A is less than 70 mol %, the insulation property of the piezoelectric material may be degraded. In contrast, when the ratio of Bi occupying A exceeds 99.9 mol %, the performance almost equal to that in the case where a lanthanoide element is not added is obtained. It should be noted that, in the present invention, the term "mol %" refers to the amount of substance of a specified element with respect to the total amount of substance occupying a specified site by a percentage.

The Curie temperature desired in the piezoelectric material of the present invention is 200° C. or more and 600° C. or less, more preferably 200° C. or more and 500° C. or less. When the Curie temperature is equal to or more than 200° C., in the case where the piezoelectric material is used in a device, a material with less fluctuation in characteristics depending upon temperature can be provided. Further, when the Curie temperature is equal to or less than 600° C., a material that can be polarized easily during the formation of a device can be provided. Generally, as the ratio of a lanthanoid element contained in A is larger, the Curie temperature tends to be lower.

Further, incorporating a moderate amount of Mn into the piezoelectric material of the present invention improves the insulation property of the piezoelectric material. A highly insulative piezoelectric material has an advantage in that the material can withstand polarization treatment under a high voltage, and is also excellent in conversion efficiency between electric energy and mechanical energy. In addition, incorporating a moderate amount of Mn into the piezoelectric material of the present invention exerts an effect by which the piezoelectric material can be polarized with an additionally low voltage.

A raw material to be used when Mn is incorporated into the piezoelectric material of the present invention may be divalent Mn, or may be tetravalent Mn. The same effects can be expected when an Mn element is contained in a crystal grain boundary as an oxide, as well as when an Mn element is contained in the B site of the perovskite structure.

In the general formula (1), M can contain 0.1 mol % or more and 5 mol % or less, in particular, 0.1 mol % or more and 1 mol % or less of the Mn element. When the content of Mn in M is smaller than 0.1 mol %, the extent to which the insulation property is improved becomes small. In contrast, when the content of Mn in the B site is larger than 5 mol %, the piezoelectric effect of the piezoelectric material may become small.

In the piezoelectric material of the present invention, the crystal system of the perovskite-type metal oxide represented by the general formula (1) preferably contains at least a monoclinic structure. A more preferred crystal system is a crystal system formed only of a monoclinic structure.

In the present invention, a monoclinic structure, a rhombohedral structure, and a tetragonal structure are defined as follows, provided that the following "=" indicates "to be substantially equal". "≠" indicates "not to be equal". A β-angle represents an angle formed by the a-axis and c-axis of a crystal lattice.

Rhombohedral crystal: a-axis lattice parameter=c-axis lattice parameter, and β-angle≠90°
Monoclinic crystal: a-axis lattice parameter≠c-axis lattice parameter, and β-angle≠90°
Tetragonal crystal: a-axis lattice parameter≠c-axis lattice parameter, and β-angle=90°

As described above, in the present invention, the aspect ratio of the tetragonal structure is suppressed by $A(Mg_kTi_{(1-k)})O_3$ in addition to the binary solid solution of $A(Zn_jTi_{(1-j)})O_3$ and $AMO_3$. As a result, the energy barrier to the switching between the rhombohedral structure and the tetragonal structure becomes small, and hence the piezoelectricity is improved.

In addition to the main mechanism, the energy barrier to the switching between the respective structures becomes additionally small when the crystal system of the perovskite-type metal oxide represented by the general formula (1) includes a monoclinic structure. This probably results from the fact that the unit cell of the monoclinic structure is intermediate in volume between the unit cell of the rhombohedral structure and the unit cell of the tetragonal structure, and the fact that the unit cell of the monoclinic structure has a polarization moment in its (110)-axis direction. That is, the piezoelectric material of the present invention becomes able to easily switch polarization moments so as to rotate in three directions, i.e., a (001) axis, a (110) axis, and a (111) axis. As a result, a displacement amount by a piezoelectric phenomenon per intensity of an external electric field increases. That is, a piezoelectric constant increases.

The characteristics of the piezoelectric material of the present invention lie in its component composition and crystal structure, and a method of producing the piezoelectric material is not limited. For example, when the piezoelectric material is in the form of a bulk ceramic, a general ceramic production method involving sintering the powders of the respective metal raw materials under ambient pressure can be adopted. When A in the general formula (1) is formed only of the Bi element, the sintering under ambient pressure may result in insufficient crystallization. In that case, an approach such as a high-pressure synthesis method, an electrical resistance heating method, a microwave sintering method, or a millimeter wave sintering method can also be employed. The term "bulk ceramic" as used in the present invention refers to a bulk substance as a result of the aggregation of particles. The case where the piezoelectric material is in the form of a film is described later.

It is desired that the piezoelectric material be a film provided on a substrate and having a thickness of 200 nm or more and 10 μm or less, more preferably 250 nm or more and 3 μm or less. When the film thickness of the piezoelectric material is set to 200 nm or more and 10 μm or less, an electromechanical coupling function sufficient as a piezoelectric element can be obtained and the increase in integrate density of the piezoelectric element can be expected.

A method of stacking the film is not particularly limited. Examples of the method include a metal organic chemical vapor deposition method (MOCVD method), a chemical solution deposition method (CSD method), a pulse laser deposition method (PLD method), a sputtering method, a hydrothermal synthesis method, and an aerosol deposition method (AD method). Of those, the preferred stacking method is the metal organic chemical vapor deposition method, the chemical solution deposition method, or the pulse laser deposition method. The metal organic chemical vapor deposition method, the chemical solution deposition method, and the pulse laser deposition method are each a film formation method excellent in precise control of a metal composition.

The term "metal organic chemical vapor deposition method (MOCVD method)" as used in the present invention refers to a generic name for film formation methods with which an intended metal oxide grows on a substrate by thermal decomposition of a metal organic compound sent by carrier gas. The term "metal organic chemical vapor deposition method" comprehends a film formation method generally called metal organic vapor phase epitaxy method, MOCVD method, or MOVPE method.

The term "chemical solution deposition method (CSD method)" as used in the present invention refers to a generic term for film formation methods with which an intended metal oxide is obtained by applying a precursor solution of the intended metal oxide onto a substrate, followed by heating and crystallization. The term "chemical solution deposition method" comprehends film formation methods generally called sol-gel method, or organic metal decomposition method.

Examples of a metal compound to be included in a precursor solution used in the MOCVD method or the CSD method include a hydrolyzable or thermally degradable metal organic compound. Typical examples thereof include a metal alkoxide of a metal, an organic acid salt, and a metal complex such as a β-diketone complex each contained in an intended material.

The term "pulse laser deposition method (PLD method)" as used in the present invention refers to a generic name for film formation methods with which a metal oxide grows from the vapor on the substrate by using plasma, which is generated when a pulse laser within several tens of nanoseconds (ns) enters a target material. The term "pulse laser deposition method" comprehends a film formation method generally called pulse laser vapor deposition method, pulse laser film formation method, laser ablation method, or molecular beam epitaxy method.

The target material used in the PLD method may be a sintered compact identical in composition to the target metal oxide, or may be a multiple system grouped into metal species having different film deposition rates.

Although a material for a substrate on which a film-shaped piezoelectric material is provided is not particularly preferred, a material that neither deforms nor melts in a baking process to be typically performed at 800° C. or less is preferred. For example, a single-crystal substrate formed of magnesium oxide (MgO), strontium titanate ($SrTiO_3$), or the like, a ceramic substrate formed of zirconia ($ZrO_2$), alumina ($Al_2O_3$), silica ($SiO_2$), or the like, a semiconductor substrate formed of silicon (Si), tungsten (W), or the like, or a heat-resistant stainless (SUS) substrate is used preferably. A plurality of kinds of those materials may be combined or the materials may be laminated to form a multi-layered configuration. A conductive metal may be doped in a substrate or laminated on the surface of a substrate for the purpose of allowing the conductive metal to function as one of the electrodes of the piezoelectric element.

Further, it is preferred that the film-shaped piezoelectric material be selectively (001) oriented, (110) oriented, or (111) oriented.

The phrase "a film-shaped piezoelectric material is (hkl) oriented" refers to a state in which a (hkl) axis is oriented in a thickness direction. The oriented state of the film-shaped piezoelectric material can be easily identified from the detection angle and intensity of a diffraction peak in X-ray diffraction measurement (such as a 2θ/θ method) generally employed for a crystal thin film. In a diffraction chart obtained from a thin-film material selectively (hkl) oriented, the intensity of a diffraction peak detected at an angle corresponding to the (hkl) plane is much larger than the total of the intensities of peaks detected at angles corresponding to the other planes.

When the film-shaped piezoelectric material is (001), (110), or (111) oriented, polarization moments are aligned in a direction perpendicular to the film, and hence an improvement in a piezoelectric effect can be expected.

Next, a piezoelectric element of the present invention is described.

The piezoelectric element according to the present invention is a piezoelectric element having at least a piezoelectric material and a pair of electrodes provided so as to contact the piezoelectric material, in which the piezoelectric material is the above-mentioned piezoelectric material.

Figure 1:
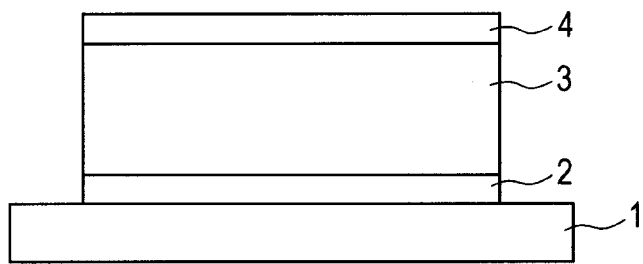
FIG. 1 is a schematic vertical sectional view illustrating an example of an embodiment of a piezoelectric element of the present invention.

FIG. 1 is a schematic vertical sectional view illustrating an example of an embodiment of the piezoelectric element according to the present invention. In FIG. 1, the piezoelectric element includes a substrate 1, a lower electrode 2, a piezoelectric material 3, and an upper electrode 4. The piezoelectric element according to the present invention includes, on the substrate 1, the piezoelectric material 3 and a pair of the lower electrode 2 and the upper electrode 4 provided in contact with the piezoelectric material 3.

Although the substrate 1 is not indispensable in the configuration of the piezoelectric element of the present invention, the piezoelectric material 3 is preferably provided on the substrate 1 so as to maintain its shape when the material is of a film shape. The lower electrode 2 may be provided so as to contact both the substrate 1 and the piezoelectric material 3 as illustrated in FIG. 1.

A material for the substrate 1 is not particularly limited, and a material that neither deforms nor melts in a baking process to be typically performed at 800° C. or less is preferred as described for the piezoelectric material.

A material that can be used in the substrate 1 is as described above. In addition, the substrate used in the piezoelectric element of the present invention is preferably a single-crystal substrate selectively (100) oriented, (110) oriented, or (111) oriented.

The use of a single-crystal substrate oriented in a specific direction can strongly orient the film-shaped piezoelectric material provided for the surface of the substrate in the same orientation.

Further, the lower electrode 2 and upper electrode 4 of the piezoelectric element are each formed of a conductive layer having a thickness of about 5 nm to 2000 nm. A material for the conductive layer is not particularly limited, and has only to be a material typically used in a piezoelectric element. Examples of such material include metals such as Ti, Pt, Ta, Ir, Sr, In, Sn, Au, Al, Fe, Cr, Ni, Pd, Ag, and Cu, and oxides of these metals. Each of the lower electrode 2 and the upper electrode 4 may be formed of one kind of those materials, or may be obtained by laminating two or more kinds thereof.

Further, at least one of the lower electrode 2 and the upper electrode 4 is preferably formed of a perovskite-type metal oxide represented by $M1RuO_3$ (M1 represents at least one kind selected from the group consisting of Sr, Ba, and Ca).

The application of such conductive metal oxide to the lower electrode 2 or the upper electrode 4 improves the consistency of a crystal lattice at a contact interface with the piezoelectric thin film formed of the piezoelectric material 3, and hence improvements in the piezoelectricity and driving durability of the piezoelectric element can be expected. In particular, when the lower electrode 2 is the conductive oxide, the electrode serves to promote the perovskite crystallization of the piezoelectric thin film, and hence improvements in the insulation property and piezoelectricity of the piezoelectric element can be expected.

Each of the lower electrode 2 and the upper electrode 4 may be formed by application based on a liquid phase film formation method such as the chemical solution deposition method followed by baking, or may be formed by a vapor phase film formation method such as the pulse laser deposition method, the sputtering method, or a vapor deposition method. Alternatively, both the lower electrode 2 and the upper electrode 4 may each be patterned into a desired shape before being used. The piezoelectric material 3 may be similarly patterned into a desired shape before being used in the element.

The piezoelectric material of the present invention can be used in devices such as a piezoelectric sensor, an ultrasonic vibrator, a piezoelectric actuator, an ink-jet head, a ferroelectric memory, and a capacitor.

Figure 2A:
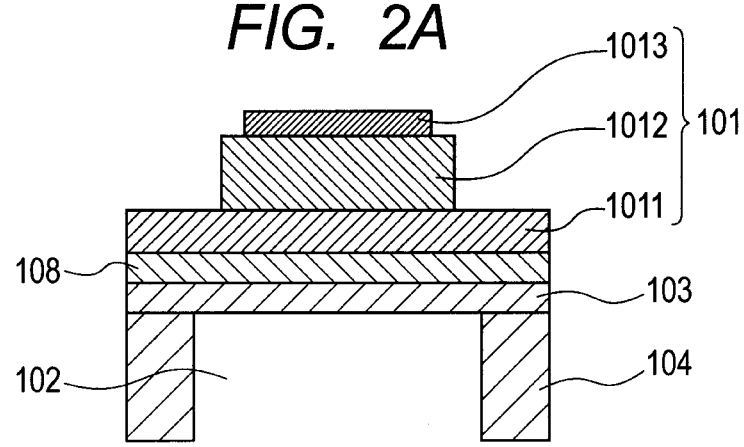
FIGS. 2A and 2B are each a schematic view illustrating an embodiment of the configuration of a liquid discharge head of the present invention.
Figure 2B:
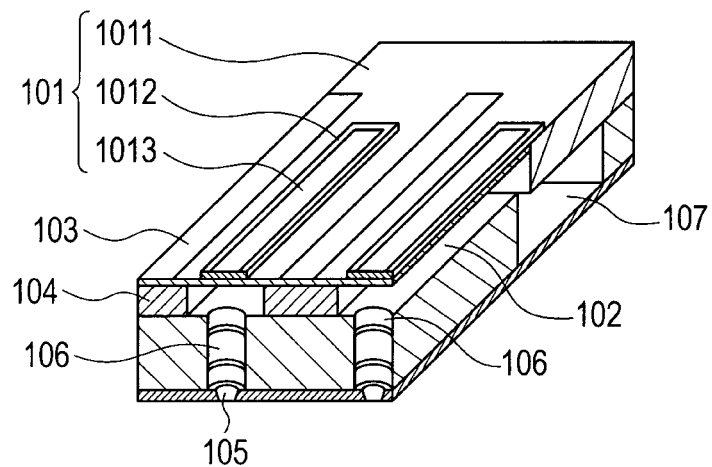

FIGS. 2A and 2B are each a schematic view illustrating an embodiment of the configuration of a liquid discharge head of the present invention. As illustrated in FIGS. 2A and 2B, the liquid discharge head of the present invention is a liquid discharge head having a piezoelectric element 101 of the present invention. The piezoelectric element 101 is a piezoelectric element having at least a first electrode 1011, a piezoelectric material 1012, and a second electrode 1013. The piezoelectric material 1012 is patterned as required as illustrated in FIG. 2B.

FIG. 2B is a schematic view of the liquid discharge head. The liquid discharge head has discharge ports 105, individual liquid chambers 102, communicating holes 106 for connecting the individual liquid chambers 102 and the discharge ports 105, liquid chamber partition walls 104, a common liquid chamber 107, a diaphragm 103, and the piezoelectric elements 101. Each of the piezoelectric elements 101, which is of a rectangular shape in the figure, may be of a shape except the rectangular shape such as an elliptical shape, a circular shape, or a parallelogram shape. In general, the piezoelectric materials 1012 are each of a shape in conformity with the shape of the individual liquid chamber 102.

The vicinity of the piezoelectric element 101 in the liquid discharge head of the present invention is described in detail with reference to FIG. 2A. FIG. 2A is a sectional view of the piezoelectric element in the width direction of the liquid discharge head illustrated in FIG. 2B. The sectional shape of the piezoelectric element 101, which is illustrated in a rectangular shape, may be a trapezoidal shape or a reverse trapezoidal shape.

In the figure, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode.

It should be noted that those differences in name are caused by a method of producing the device and an effect of the present invention can be obtained in any case.

In the liquid discharge head, the diaphragm 103 vertically fluctuates owing to the expansion and contraction of the piezoelectric material 1012 to apply a pressure to a liquid in the individual liquid chamber 102. As a result, the liquid is discharged from the discharge port 105. The liquid discharge head of the present invention can be used in a printer application or the production of an electronic device.

The diaphragm 103 has a thickness of 1.0 μm or more and 15 μm or less, preferably 1.5 μm or more and 8 μm or less. A material for the diaphragm, which is not limited, is preferably Si. Si for the diaphragm may be doped with B or P. In addition, the buffer layer and the electrode layer on the diaphragm may serve as part of the diaphragm.

The buffer layer 108 has a thickness of 5 nm or more and 300 nm or less, preferably 10 nm or more and 200 nm or less.

The size of the discharge port 105 is 5 μm or more and 40 μm or less in terms of a circle-equivalent diameter. The shape of the discharge port 105 may be a circular shape, or may be a star shape, a rectangular shape, or a triangular shape.

Next, an ultrasonic motor using the piezoelectric element of the present invention is described.

Figure 3A:
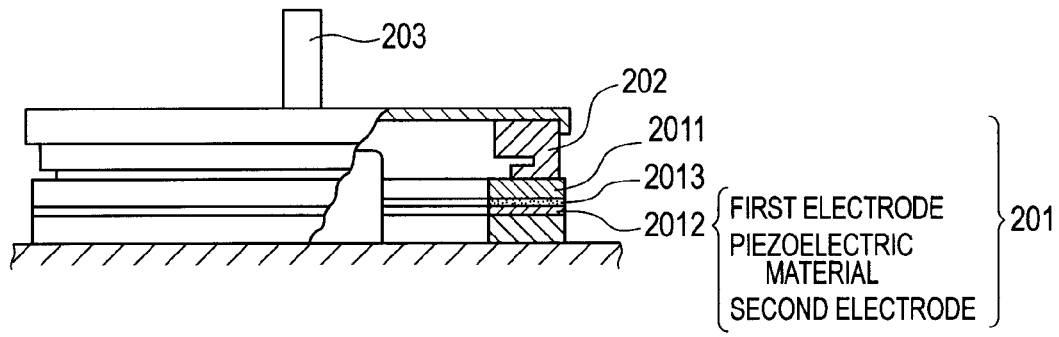
FIGS. 3A and 3B are each a schematic view illustrating an embodiment of the configuration of an ultrasonic motor of the present invention.
Figure 3B:
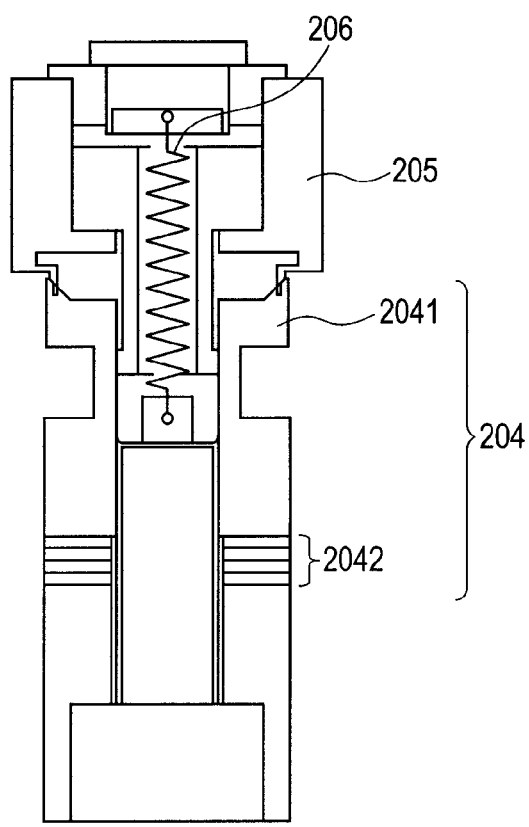

FIGS. 3A and 3B are schematic views illustrating an embodiment of a structure of the ultrasonic motor of the present invention.

FIG. 3A illustrates the ultrasonic motor formed of the single piezoelectric element of the present invention.

The ultrasonic motor has a transducer 201, a rotor 202 contacting the sliding surface of the transducer 201 by virtue of a pressure applied from a pressurizing spring (not illustrated), and an output axis 203 provided so as to be integral with the rotor 202. The transducer 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric material interposed between a first electrode and a second electrode (not illustrated).

The application of two alternating voltages different from each other in phase by $\pi/2$ to the piezoelectric element of the present invention results in the generation of a flexural progressive wave in the transducer 201, and hence each point on the sliding surface of the transducer 201 undergoes an elliptical motion. When the rotor 202 is brought into press contact with the sliding surface of the transducer 201, the rotor 202 receives a frictional force from the transducer 201 to rotate in the direction opposite to the flexural progressive wave. A member to be driven (not illustrated) is joined to the output axis 203, and is driven by the rotary force of the rotor 202.

The application of a voltage to the piezoelectric material results in the expansion and contraction of the piezoelectric material due to a piezoelectric lateral effect. When an elastic body such as a metal is joined to the piezoelectric element, the elastic body is bent by the expansion and contraction of the piezoelectric material. The ultrasonic motor of the kind described here utilizes the principle.

Next, an ultrasonic motor including a piezoelectric element having a stacked structure is illustrated in FIG. 3B. A transducer 204 is formed of a stacked piezoelectric element 2042 interposed between cylinder metal elastic bodies 2041. The stacked piezoelectric element 2042 is an element formed of multiple stacked piezoelectric materials (not illustrated), and has a first electrode and a second electrode on its outer surface of the stack, and inner electrodes on its inner surface of the stack. The metal elastic bodies 2041 are fastened with bolts so that the piezoelectric element 2042 may be interposed between and fixed by the bodies. Thus, the transducer 204 is formed.

The application of alternating voltages different from each other in phase to the piezoelectric element 2042 causes the transducer 204 to excite two vibrations perpendicular to each other. The two vibrations are synthesized to form a circular vibration for driving the tip portion of the transducer 204. It should be noted that a constricted circumferential groove is formed in the upper portion of the transducer 204 to enlarge the displacement of the vibration for driving.

A rotor 205 contacts the transducer 204 under a pressure from a spring 206 for pressurization to obtain a frictional force for driving. The rotor 205 is rotatably supported by a bearing.

As described above, the piezoelectric element of the present invention is suitably applicable to the liquid discharge head and the ultrasonic motor.

The use of the lead-free piezoelectric material of the present invention can provide a liquid discharge head having a nozzle density and a discharge force comparable to or more than those in the case where a piezoelectric material containing lead is used.

The use of the lead-free piezoelectric material of the present invention can provide an ultrasonic motor having a driving force and durability comparable to or more than those in the case where a piezoelectric material containing lead is used.

Hereinafter, the present invention is described more specifically by way of examples. However, the present invention is not limited by the following examples.

Examples 1 to 11 and 16 to 26

Metal oxide thin films having compositions corresponding to the respective examples of Table 1 and Table 3 were each formed on a substrate by an pulsed metal organic chemical vapor deposition method (MOCVD method).

A (100)-oriented strontium titanate ($SrTiO_3$) single-crystal substrate having strontium ruthenate ($SrRuO_3$) having a thickness of about 100 nm as a lower electrode on its film formation surface was used as the substrate on which any such thin film was formed. The $SrRuO_3$ electrode was formed by a sputtering method.

There were used, as raw materials of the respective oxides of the metals, dimethyl(2-(N,N-dimethylaminomethyl)phenyl)bismuth ($Bi(CH_3)_2(2-(CH_3)_2NCH_2Ph)$), tri(ethylpentadienyl)iron ($Fe(C_2H_5C_5H_4)_3$), zinc bis(6-ethyl-2,2-dimethyl-3,5-decanedionate) ($Zn(EDMDD)_2$), magnesium bis(2,2,6,6-tetramethyl-3,5-heptanedionate) ($Mg(DPM)_2$), and tetra-i-propoxytitanium ($Ti(O.i-Pr)_4$).

Nitrogen was used as a carrier gas, and oxygen and nitrogen were each used as a purge gas. The film formation was intermittently performed by stopping the supply of any such gas for 5 seconds every time the gas was supplied for 10 seconds. A film formation temperature was set to 760° C. The film formation was performed for a total of 200 pulses (50 minutes). Thus, a thin film based on the piezoelectric material of the present invention having a thickness of 190 nm to 600 nm was obtained.

x, j, k, l, m, and n shown in Table 1 and Table 3 represent the metal compositional ratios of the piezoelectric thin films of the examples, and are normalized so that the relationship of l+m+n=1 may be established. Those values were determined by employing X-ray fluorescence analysis (XRF) and ICP spectrometry in combination. The adjustment of film formation conditions for the MOCVD method with ideal values for x, j, and k set to 1.0, 0.5, and 0.5, respectively was able to result in a scheduled compositional ratio. Results obtained for l, m, and n were each correct to three significant figures by virtue of detailed composition analysis.

X-ray diffraction measurement found that each of the piezoelectric materials was of a perovskite structure selectively (001) oriented. In addition, the crystal systems of the materials were each a mixed system having a tetragonal structure and a monoclinic structure, a single system of a monoclinic structure, or a mixed system having a monoclinic structure and a rhombohedral structure. In addition, the lattice parameter of the long axis of a unit cell converted from a peak position tended to shorten as the value for m increased.

The surfaces of those thin film-shaped piezoelectric materials were provided with platinum electrodes each having a diameter of 100 μm by a sputtering method. Thus, piezoelectric elements were obtained. The insulation property of each of the piezoelectric elements of Examples 1 to 11 and 16 to 26 was good. Those piezoelectric elements were used for electrical measurement. Table 1 and Table 3 show the results together with the compositions.

Ferroelectricity shown in each of Table 1 and Table 3 shows the result of P-E hysteresis measurement for each of the piezoelectric elements. The P-E hysteresis measurement was performed for judging whether an element of interest showed ferroelectricity at room temperature in a practical electric field. A material showing ferroelectricity in a constant electric field region can be said to have piezoelectricity in the same electric field region, and hence can be used as a memory material. Specifically, the hysteresis of spontaneous polarization when an external electric field having a maximum of ±1,500 kV/cm was applied to the piezoelectric element of the present invention with its phase positively and negatively changed was observed. When a hysteresis curve specific to a ferroelectric material in which spontaneous polarization was inverted was observed, the mark "○" was described in the column "Ferroelectricity" of each of Table 1 and Table 3. When no ferroelectricity curve was observed in the electric field range, the mark "x" was described in the column. The mark "x" includes the case where the element of interest is ferroelectric but an electric field (coercive electric field) in which the inversion of its polarization occurs outstrips the electric field range.

Insulation property shown in each of Table 1 and Table 3 shows the result of leak current measurement for each of the piezoelectric elements. The leak current measurement was performed for judging whether an element of interest showed insulation property at room temperature in a practical electric field. Specifically, a leak current value when a DC electric field of 250 kV/cm was applied to the piezoelectric element of the present invention was recorded. When the leak current value was 1 mA/cm or less, i.e., the element showed good insulation property, the mark "○" was described. Otherwise, the mark "x" was described. The leak current value of each of the piezoelectric elements of Examples 1 to 11 and 16 to 26 was 0.01 mA/cm or less. In other words, the elements each showed high insulation property comparable to that of a commercially available thin film of lead zirconate titanate.

A piezoelectric constant shown in each of Table 1 and Table 3 was determined by a piezoelectric constant ($d_{33}$ constant) measurement method at room temperature with an atomic force microscope (AFM) as a displacement detector. Specifically, the distortion of a piezoelectric material when an applied voltage per thickness of the thin film interposed between electrodes was set to 700 kV/cm was observed with the AFM. The distortion amount was divided by the applied voltage so as to be converted into the piezoelectric constant shown in each of Table 1 and Table 3. When the distortion amount of an element was so small that the piezoelectric constant was not able to be calculated, the mark "x" was described.

Comparative Examples 1, 2, and 6 to 9

Metal oxides having target compositions of Comparative Examples 1, 2, and 6 to 9 shown in Table 1 and Table 3 were produced by the MOCVD method in the same manner as in Examples 1 to 11 and 16 to 26.

The metal oxide of Comparative Example 1 is a solid solution free of the $A(Mg_kTi_{(1-k)})O_3$ component. The metal oxide of Comparative Example 2 is a solid solution containing a smaller amount of the $A(Mg_kTi_{(1-k)})O_3$ component than the piezoelectric material of the present invention does. The Examples 1 to 11, and Comparative Examples 1 and 2. Broken lines in the figure represent a range corresponding to claim 1 of the present invention. Plots inside the broken lines correspond to the compositions of Examples 1 to 11. Plots outside the broken lines correspond to the compositions of Comparative Examples 1 and 2.

TABLE 1

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 1 | Bi | Fe | 1.0 | 0.5 | 0.5 | 0.450 | 0.191 | 0.359 | Tetragonal + monoclinic | ○ | ○ | 100 |
| Example 2 | Bi | Fe | 1.0 | 0.5 | 0.5 | 0.482 | 0.212 | 0.306 | Tetragonal + monoclinic | ○ | ○ | 110 |
| Example 3 | Bi | Fe | 1.0 | 0.5 | 0.5 | 0.454 | 0.234 | 0.312 | Tetragonal + monoclinic | ○ | ○ | 130 |
| Example 4 | Bi | Fe | 1.0 | 0.5 | 0.5 | 0.462 | 0.240 | 0.298 | Tetragonal + monoclinic | ○ | ○ | 140 |
| Example 5 | Bi | Fe | 1.0 | 0.5 | 0.5 | 0.357 | 0.286 | 0.357 | Tetragonal + monoclinic | ○ | ○ | 170 |
| Example 6 | Bi | Fe | 1.0 | 0.5 | 0.5 | 0.332 | 0.332 | 0.336 | Tetragonal + monoclinic | ○ | ○ | 170 |
| Example 7 | Bi | Fe | 1.0 | 0.5 | 0.5 | 0.335 | 0.357 | 0.308 | Tetragonal + monoclinic | ○ | ○ | 180 |
| Example 8 | Bi | Fe | 1.0 | 0.5 | 0.5 | 0.346 | 0.360 | 0.294 | Tetragonal + monoclinic | ○ | ○ | 180 |
| Example 9 | Bi | Fe | 1.0 | 0.5 | 0.5 | 0.297 | 0.393 | 0.310 | Tetragonal + monoclinic | ○ | ○ | 190 |
| Example 10 | Bi | Fe | 1.0 | 0.5 | 0.5 | 0.304 | 0.410 | 0.286 | Tetragonal + monoclinic | ○ | ○ | 190 |
| Example 11 | Bi | Fe | 1.0 | 0.5 | 0.5 | 0.271 | 0.453 | 0.276 | Tetragonal + monoclinic | ○ | ○ | 200 |
| Comparative Example 1 | Bi | Fe | 1.0 | 0.5 | — | 0.666 | 0.000 | 0.334 | Tetragonal | x | ○ | x |
| Comparative Example 2 | Bi | Fe | 1.0 | 0.5 | 0.5 | 0.534 | 0.107 | 0.359 | Tetragonal | x | ○ | x | metal oxides of Comparative Examples 6 to 9 are each a solid solution free of the $A(Zn_jTi_{(1-j)})O_3$ component.

Each of the metal oxides of Comparative Examples 1, 2, and 6 to 9 had a perovskite-type structure selectively (001) oriented. Crystal systems in Comparative Examples 1 and 2 were each a single system of a tetragonal structure, and crystal systems in Comparative Examples 6 to 9 were each a single system of a rhombohedral structure.

Electrical measurement was performed by forming electrodes on the metal oxides of Comparative Examples 1, 2, and 6 to 9 in the same manner as in Examples 1 to 11 and 16 to 26. Table 1 and Table 3 show the results together with the compositions. Although the elements of Comparative Example 1 and Comparative Example 2 each had high insulation property, their coercive electric fields were so large that none of the elements showed the inversion phenomenon of spontaneous polarization in the range of ±1,500 kV/cm. The elements of Comparative Examples 6 to 9 each had high insulation property too. Although the elements of Comparative Examples 6 to 8 each showed ferroelectricity, the element of Comparative Example 9 did not show ferroelectricity.

In addition, the elements of Comparative Example 1, Comparative Example 2, and Comparative Example 9 each had a small element distortion amount in piezoelectric measurement, and the $d_{33}$ constant of each of the elements was about 10 pm/V even when approximately converted. Although the elements of Comparative Examples 6 to 9 each showed clear piezoelectricity, their piezoelectric constants ($d_{33}$) shown in Table 3 were not large.

Figure 4:
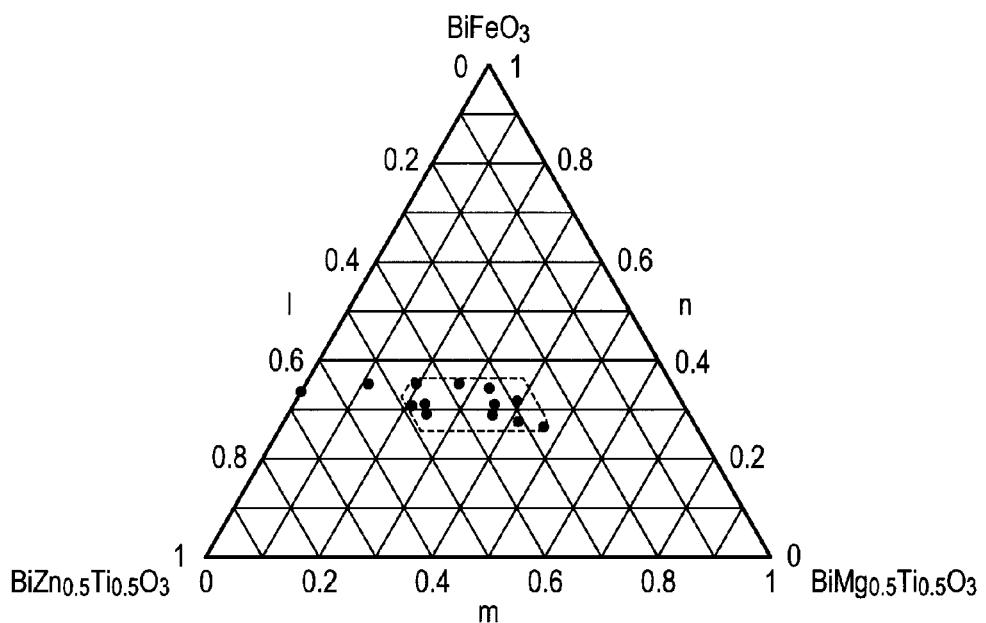
FIG. 4 is a ternary phase diagram illustrating a relationship among the compositions of metal oxides of Examples 1 to 11 of the present invention and Comparative Examples 1 and 2.

FIG. 4 illustrates a ternary phase diagram illustrating a relationship among the compositions of the metal oxides of Examples 12 and 27 to 41

Metal oxide thin films having compositions shown in Table 2 and Table 4 were each formed on a substrate by the MOCVD method in the same manner as in Examples 1 to 11 and 16 to 26.

A (110)-oriented strontium titanate ($SrTiO_3$) single-crystal substrate having strontium ruthenate ($SrRuO_3$) having a thickness of about 100 nm as a lower electrode on its film formation surface was used as the substrate on which any such thin film was formed. The $SrRuO_3$ electrode was formed by a sputtering method.

There were used, as raw materials of the respective oxides of the metals, tri(2,2,6,6-tetramethyl-3,5-heptanedionate) (2,2-bipyridyl)lanthanum ($La(TMOD)_3bpy$) and manganese tri(2,2,6,6,-tetramethyl-3,5-heptanedionate) ($Mn(DPM)_3$), in addition to the raw materials used in Examples 1 to 11.

A thin film based on the piezoelectric material of the present invention having a thickness of 200 nm to 450 nm was obtained under the same film formation conditions as those of Examples 1 to 11 and 16 to 26.

x, j, k, l, m, and n shown in Table 2 were calculated in the same manner as in Examples 1 to 11 and 16 to 26.

X-ray diffraction measurement found that each of the piezoelectric materials was of a perovskite structure selectively (110) oriented. In addition, the crystal systems of the materials were each a mixed system having a tetragonal structure and a monoclinic structure, or a single system of a monoclinic structure.

The surfaces of those thin film-shaped piezoelectric materials were provided with platinum electrodes each having a diameter of 100 μm by a sputtering method. Thus, piezoelectric elements were obtained. The results of the measurement of the electrical properties and piezoelectric properties of the piezoelectric elements are as shown in Table 2 and Table 4.

Comparative Examples 10 and 11

Metal oxides having target compositions of Comparative Examples 10 and 11 shown in Table 4 were produced by the MOCVD method in the same manner as in Examples 27 to 41. The metal oxides of Comparative Examples 10 and 11 are each a solid solution free of the $A(Zn_jTi_{(1-j)})O_3$ component.

The metal oxides of Comparative Examples 10 and 11 each had a perovskite-type structure selectively (110) oriented, and their crystal systems were each a single system of a rhombohedral structure.

Electrical measurement was performed by forming electrodes on the metal oxides of Comparative Examples 10 and 11 in the same manner as in Examples 27 to 41. Table 4 shows the results together with the compositions. The elements of Comparative Example 10 and Comparative Example 11 each had high insulation property and ferroelectricity. In addition, the elements of Comparative Examples 10 and 11 each showed clear piezoelectricity, but their piezoelectric constants ($d_{33}$) shown in Table 4 were not large.

Examples 13, 14, and 42 to 57

Metal oxide thin films having compositions shown in Table 2 and Table 5 were each formed on a substrate by the MOCVD method in the same manner as in Examples 1 to 12 and 16 to 41.

A (111)-oriented strontium titanate ($SrTiO_3$) single-crystal substrate having strontium ruthenate ($SrRuO_3$) having a thickness of about 100 nm as a lower electrode on its film formation surface was used as the substrate on which any such thin film was formed. The $SrRuO_3$ electrode was formed by a sputtering method.

There was used in Examples 13 and 14, as raw materials of the respective oxides of the metals, aluminum tri(2,2,6,6-tetramethyl-3,5-heptanedionate) ($Al(DPM)_3$), in addition to the raw materials used in Examples 1 to 12 and 16 to 41.

A thin film based on the piezoelectric material of the present invention having a thickness of 210 to 550 nm was obtained under the same film formation conditions as those of Examples 1 to 12 and 16 to 41.

x, j, k, l, m, and n shown in Table 2 were calculated in the same manner as in Examples 1 to 12 and 16 to 41.

X-ray diffraction measurement found that each of the piezoelectric materials was of a perovskite structure selectively (111) oriented. In addition, the crystal systems of the materials were each a mixed system having a tetragonal structure and a monoclinic structure, or a single system of a monoclinic structure.

The surfaces of those thin film-shaped piezoelectric materials were provided with platinum electrodes each having a diameter of 100 μm by a sputtering method. Thus, piezoelectric elements were obtained. The results of the measurement of the electrical properties and piezoelectric properties of the piezoelectric elements are as shown in Table 2 and Table 5.

Comparative Examples 12 and 13

Metal oxides having target compositions of Comparative Examples 12 and 13 shown in Table 5 were produced by the MOCVD method in the same manner as in Examples 42 to 57. The metal oxides of Comparative Examples 12 and 13 are each a solid solution free of the $A(Zn_jTi_{(1-j)})O_3$ component.

The metal oxides of Comparative Examples 12 and 13 each had a perovskite-type structure selectively (111) oriented, and their crystal systems were each a single system of a rhombohedral structure.

Electrical measurement was performed by forming electrodes on the metal oxides of Comparative Examples 12 and 13 in the same manner as in Examples 42 to 57. Table 5 shows the results together with the compositions. The elements of Comparative Example 12 and Comparative Example 13 each had high insulation property and ferroelectricity. In addition, the elements of Comparative Examples 12 and 13 each showed clear piezoelectricity, but their piezoelectric constants ($d_{33}$) shown in Table 4 were not large.

Examples 15 and 69 to 72

$Bi_2O_3$, $La_2O_3$, $Dy_2O_3$, $Pr_2O_3$, ZnO, MgO, $TiO_2$, $Fe_2O_3$, $Al_2O_3$, $Sc_2O_3$, $Y_2O_3$, and $MnO_2$ were mixed at the same molar ratios as the final product compositions shown in Table 2 and Table 8, and were then pulverized. Thus, mixed powders of raw materials were obtained. Polyvinyl butyral (PVB) was added as a binder at 10 wt % to each of the mixed powders, and then the contents were mixed in a mortar. The resultant product was molded into a circular disk shape having a diameter of 10 mm, and then the disk was pre-baked in an electric furnace at 600° C. for 2 hours. Subsequently, the pre-baked product was post-baked in an electric furnace at 850° C. to 1350° C. for 5 hours. Thus, bulk ceramic-like piezoelectric materials of the present invention were obtained.

x, j, k, l, m, and n shown in Table 2 were calculated by the same approach as that of any one of Examples 1 to 14 and 16 to 57 where the piezoelectric materials were each of a film shape.

X-ray diffraction measurement found that each of the piezoelectric materials of Examples 15 and 69 to 72 was of a randomly oriented, polycrystalline perovskite structure. In addition, the crystal systems of the materials were each a mixed system having a tetragonal structure and a monoclinic structure, or a single system of a monoclinic structure. The surfaces of the piezoelectric materials were polished so that the materials were each processed into a disk shape having a diameter of 2.5 mm and a thickness of 0.25 mm. Electrodes were formed on both surfaces of the disk with a gold ion coater, and then the resultant product was used in electrical measurement and piezoelectric property measurement. Methods of measuring ferroelectricity and insulation property are identical to those of Examples 1 to 14 and 16 to 57. A laser Doppler velocimeter was used in distortion measurement for determining a piezoelectric constant. The results are as shown in Table 2 and Table 8.

Comparative Examples 3 to 5

Metal oxides having compositions of Comparative Examples 3 to 5 shown in Table 2 were produced in the same manner as in Example 15. The results of the evaluations of the metal oxides for their crystal structures, electrical properties, and piezoelectric properties are as shown in Table 2.

The composition of Comparative Example 3 was $(Bi_{0.7}La_{0.3})_{1.1}FeO_3$. X-ray diffraction measurement found that the metal oxide was of a non-oriented, rhombohedral perovskite structure.

The composition of Comparative Example 4 aimed at a solid solution of $(Bi_{0.7}La_{0.3})_{1.1}FeO_3$ and $(Bi_{0.7}La_{0.3})_{1.1}$ $(Zn_{0.5}Ti_{0.5})O_3$ while the composition of Comparative Example 5 aimed at $(Bi_{0.7}La_{0.3})_{1.1}(Zn_{0.5}Ti_{0.5})O_3$. However, according to X-ray diffraction measurement, the main phase of each of the metal oxides was a bismuth layer structure, and no metal oxide having a perovskite structure was able to be obtained.

Electrodes were formed on the metal oxides of Comparative Examples 3 to 5 in the same manner as in Example 15, and then the resultant products were used in electrical measurement and piezoelectric property measurement. Methods of measuring ferroelectricity, insulation property, and a piezoelectric constant are identical to those of Example 15.

Examples 58 to 65

Metal oxide thin films having compositions corresponding to the respective examples of Table 6 were each formed on a substrate by a pulse laser deposition method (PLD method).

A (100)-oriented strontium titanate ($SrTiO_3$) single-crystal substrate having (100)-oriented strontium ruthenate ($SrRuO_3$) having a thickness of about 100 nm as a lower electrode on its film formation surface was used as the substrate on which each of the thin films of Examples 58 to 61, 64, and 65 was formed. The $SrRuO_3$ electrode was formed by a sputtering method.

A (0001)-surface-cut sapphire ($Al_2O_3$) single-crystal substrate having (111)-oriented strontium ruthenate ($SrRuO_3$) having a thickness of about 100 nm as a lower electrode on its film formation surface was used as the substrate on which each of the thin films of Examples 62 and 63 was formed.

Used as a target material on which pulse laser was incident was a pellet obtained by: mixing $Bi_2O_3$, $La_2O_3$, ZnO, MgO, $TiO_2$, and $Fe_2O_3$; pulverizing the mixture; pre-baking the pulverized product in an electric furnace at 750° C. for 5 hours; further adding 10 wt % of PVB to the pre-baked powder; molding the mixture; and post-baking the molded product in an electric furnace at 790° C. for 6 hours. It should be noted that the contents of $Bi_2O_3$ and ZnO were each made excessive by 5 to 20 at. % with respect to the target composition of the piezoelectric material in consideration of a fluctuation in composition at the time of film formation.

Film formation conditions for the PLD method are as described below.

Laser: KrF excimer laser, 210 mJ
Pulse interval: 2 Hz
Distance between the target and the substrate: 40 mm
Film formation pressure: An oxygen atmosphere at 500 mTorr and a flow rate of 3 sccm
Substrate temperature: 630° C.

Film formation was performed for a total of 4,800 pulses (40 minutes). Thus, a thin film based on the piezoelectric material of the present invention having a thickness of 200 nm to 530 nm was obtained.

x, j, k, l, m, and n shown in Table 6 were calculated by the same approach as that of any one of Examples 1 to 14 and 16 to 57 where the piezoelectric materials were each of a film shape.

X-ray diffraction measurement found that each of the piezoelectric materials of Examples 58 to 61, and 64 and 65 was of a perovskite structure selectively (001) oriented. Each of the piezoelectric materials of Examples 62 and 63 was of a perovskite structure selectively (111) oriented. In addition, the crystal systems of the materials were each a mixed system having a tetragonal structure and a monoclinic structure, a single system of a monoclinic structure, or a mixed system having a monoclinic structure and a rhombohedral structure. The surfaces of those thin film-shaped piezoelectric materials were provided with platinum electrodes each having a diameter of 100 µm by a sputtering method. Thus, piezoelectric elements were obtained. The results of the measurement of the electrical properties and piezoelectric properties of the piezoelectric elements are as shown in Table 6.

Comparative Example 14

A metal oxide having a target composition of Comparative Example 14 shown in Table 6 was produced by the PLD method in the same manner as in Examples 58 to 61, and 64 and 65.

The metal oxide of Comparative Example 14 is a solid solution free of the $A(Mg_kTi_{(1-k)})O_3$ component. According to X-ray diffraction measurement, the main phase of the metal oxide of Comparative Example 14 was a bismuth layer structure, and no metal oxide having a perovskite structure was able to be obtained.

Electrical measurement was performed by forming electrodes on the metal oxide of Comparative Example 14 in the same manner as in Examples 58 to 61, and 64 and 65. Table 6 shows the results together with the composition. The element of Comparative Example 14 was poor in insulation property, and showed neither ferroelectricity nor piezoelectricity.

Examples 66 to 68

Metal oxide thin films having compositions corresponding to the respective examples of Table 7 were each formed on a substrate by a chemical solution deposition method (CSD method).

A (100)-oriented strontium titanate ($SrTiO_3$) single-crystal substrate having (100)-oriented strontium ruthenate ($SrRuO_3$) having a thickness of about 100 nm as a lower electrode on its film formation surface was used as the substrate on which each of the thin films of Examples 66 and 67 was formed. The $SrRuO_3$ electrode was formed by a sputtering method.

A silicon substrate (with an $SiO_2$ oxide film) having (111)-naturally oriented platinum (Pt) having a thickness of 200 nm as a lower electrode on its film formation surface was used as the substrate on which the thin film of Example 68 was formed. The Pt electrode was formed by a sputtering method.

Precursor solutions for metal oxides to be used in CSD film formation were prepared according to the following procedure.

Used as raw materials for the precursor solutions were tri-t-amyloxybismuth $(Bi(O.t-Am)_3)$, zinc acetate dihydrate $(Zn(OAc)_2.2H_2O)$, diethoxymagnesium $(Mg(OEt)_2)$, tetra-n-butoxytitanium $(Ti(O.n-Bu)_4)$, and iron acetylacetonate $(Fe(acac)_3)$.

The raw materials were each added at the same molar ratio as the target composition shown in Table 7 in terms of a metal to 2-methoxyethanol as a solvent, and were then dissolved under stirring. Added to a system using zinc acetate dihydrate was an equal mole of monoethanolamine for aiding the solubility of a zinc component.

A moderate amount of 2-methoxyethanol was added to each solution so that the resultant solution had a concentration of 0.1 mol/L. Thus, application solutions used in Examples 66 to 68 were obtained.

The precursor solutions corresponding to the respective examples of Table 7 were each applied onto the substrate with a spin coater (3,000 rpm). The applied layer was dried under heating with a hot plate at 150° C. for 1 minute so that the solvent was removed. After that, the resultant product was baked in a rapid thermal infrared annealing furnace (hereinafter, referred to as "RTA") at 500° C. for 1 minute. Thus, a first layer was formed. Next, layers like a second layer and a third layer were repeatedly stacked on the first layer in the same manner as in the first layer. Thus, a total of 27 stacked films were obtained. Finally, the stacked films were baked under a nitrogen atmosphere in the RTA at 700° C. for 3 minutes so as to be crystallized. Thus, a thin film based on the piezoelectric material of the present invention having a thickness of 250 nm to 400 nm was obtained.

x, j, k, l, m, and n shown in Table 7 were calculated in the same manner as in Examples 1 to 14 and 16 to 65 where the piezoelectric materials were each of a film shape.

X-ray diffraction measurement found that each of the piezoelectric materials of Examples 66 and 67 was of a (001) oriented, polycrystalline perovskite structure. The piezoelectric material of Example 68 was of a randomly oriented, polycrystalline perovskite structure. In addition, the crystal systems of the materials were each a mixed system having a tetragonal structure and a monoclinic structure, or a single system of a monoclinic structure.

The surfaces of those thin film-shaped piezoelectric materials were provided with platinum electrodes each having a diameter of 100 μm by a sputtering method. Thus, piezoelectric elements were obtained. The results of the measurement of the electrical properties and piezoelectric properties of the piezoelectric elements are as shown in Table 7.

Comparative Examples 15 and 16

Metal oxides having target compositions of Comparative Examples 15 and 16 shown in Table 7 were produced by the CSD method in the same manner as in Examples 66 and 67.

The metal oxides of Comparative Examples 15 and 16 are each a solid solution free of the $A(Zn_jTi_{(1-j)})O_3$ component.

The metal oxides of Comparative Examples 15 and 16 each had a perovskite-type structure selectively (001) oriented, and their crystal systems were each a single system of a rhombohedral structure.

Electrical measurement was performed by forming electrodes on the metal oxides of Comparative Examples 15 and 16 in the same manner as in Examples 66 and 67. Table 7 shows the results together with the compositions. The elements of Comparative Example 15 and Comparative Example 16 each had high insulation property and ferroelectricity. In addition, the elements of Comparative Examples 15 and 16 each showed clear piezoelectricity, but their piezoelectric constants ($d_{33}$) shown in Table 7 were not large.

TABLE 2

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 12 | Bi 70% La 30% | Fe 95% Mn 5% | 1.2 | 0.6 | 0.6 | 0.466 | 0.260 | 0.274 | Tetragonal + monoclinic | ○ | ○ | 85 |
| Example 13 | Bi 70% La 30% | Al | 1.0 | 0.5 | 0.4 | 0.282 | 0.360 | 0.358 | Tetragonal + monoclinic | ○ | ○ | 100 |
| Example 14 | Bi 99.9% La 0.1% | Al 99.9% Mn 0.1% | 1.0 | 0.4 | 0.5 | 0.393 | 0.295 | 0.312 | Tetragonal + monoclinic | ○ | ○ | 80 |
| Example 15 | Bi 70% La 30% | Fe | 1.1 | 0.5 | 0.5 | 0.294 | 0.434 | 0.272 | Tetragonal + monoclinic | ○ | ○ | 120 |
| Comparative Example 3 | Bi 70% La 30% | Fe | 1.1 | — | — | 0.000 | 0.000 | 1.000 | Rhombohedral | x | x | 20 |
| Comparative Example 4 | Bi 70% La 30% | Fe | 1.1 | 0.5 | — | 0.695 | 0.000 | 0.305 | Non-perovskite | x | x | x |
| Comparative Example 5 | Bi 70% La 30% | Fe | 1.1 | 0.5 | — | 1.000 | 0.000 | 0.000 | Non-perovskite | x | x | x |

TABLE 3

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 16 | Bi | Fe | 1.0 | 0.5 | 0.5 | 0.349 | 0.520 | 0.131 | Monoclinic | ○ | ○ | 230 |
| Example 17 | Bi | Fe | 1.0 | 0.5 | 0.5 | 0.214 | 0.460 | 0.326 | Monoclinic | ○ | ○ | 240 |
| Example 18 | Bi | Fe | 1.0 | 0.5 | 0.5 | 0.210 | 0.482 | 0.308 | Monoclinic | ○ | ○ | 250 |
| Example 19 | Bi | Fe | 1.0 | 0.5 | 0.5 | 0.199 | 0.497 | 0.304 | Monoclinic | ○ | ○ | 270 |
| Example 20 | Bi | Fe | 1.0 | 0.5 | 0.5 | 0.177 | 0.513 | 0.310 | Monoclinic | ○ | ○ | 300 |
| Example 21 | Bi | Fe | 1.0 | 0.5 | 0.5 | 0.165 | 0.553 | 0.282 | Monoclinic | ○ | ○ | 290 |
| Example 22 | Bi | Fe | 1.0 | 0.5 | 0.5 | 0.153 | 0.538 | 0.309 | Monoclinic | ○ | ○ | 290 |
| Example 23 | Bi | Fe | 1.0 | 0.5 | 0.5 | 0.155 | 0.583 | 0.262 | Monoclinic + rhombohedral | ○ | ○ | 270 |
| Example 24 | Bi | Fe | 1.0 | 0.5 | 0.5 | 0.108 | 0.547 | 0.345 | Monoclinic + rhombohedral | ○ | ○ | 240 |
| Example 25 | Bi | Fe | 1.0 | 0.5 | 0.5 | 0.099 | 0.569 | 0.332 | Monoclinic + rhombohedral | ○ | ○ | 220 |
| Example 26 | Bi | Fe | 1.0 | 0.5 | 0.5 | 0.098 | 0.609 | 0.293 | Monoclinic + rhombohedral | ○ | ○ | 220 |
| Comparative Example 6 | Bi | Fe | 1.0 | — | 0.5 | 0.000 | 0.676 | 0.324 | Rhombohedral | ○ | ○ | 60 |
| Comparative Example 7 | Bi | Fe | 1.0 | — | 0.5 | 0.000 | 0.679 | 0.321 | Rhombohedral | ○ | ○ | 60 |

TABLE 3-continued

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Comparative Example 8 | Bi | Fe | 1.0 | — | 0.5 | 0.000 | 0.709 | 0.291 | Rhombohedral | ○ | ○ | 40 |
| Comparative Example 9 | Bi | Fe | 1.0 | — | 0.5 | 0.000 | 0.744 | 0.256 | Rhombohedral | x | ○ | x |

TABLE 4

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 27 | Bi | Fe | 1.0 | 0.5 | 0.5 | 0.374 | 0.209 | 0.417 | Tetragonal + monoclinic | ○ | ○ | 100 |
| Example 28 | Bi | Fe | 1.0 | 0.5 | 0.5 | 0.357 | 0.248 | 0.395 | Tetragonal + monoclinic | ○ | ○ | 130 |
| Example 29 | Bi | Fe | 1.0 | 0.5 | 0.5 | 0.302 | 0.325 | 0.373 | Tetragonal + monoclinic | ○ | ○ | 170 |
| Example 30 | Bi | Fe | 1.0 | 0.5 | 0.5 | 0.290 | 0.390 | 0.320 | Tetragonal + monoclinic | ○ | ○ | 190 |
| Example 31 | Bi | Fe | 1.0 | 0.5 | 0.5 | 0.343 | 0.465 | 0.192 | Tetragonal + monoclinic | ○ | ○ | 200 |
| Example 32 | Bi | Fe | 1.0 | 0.5 | 0.5 | 0.227 | 0.415 | 0.358 | Monoclinic | ○ | ○ | 220 |
| Example 33 | Bi | Fe | 1.0 | 0.5 | 0.5 | 0.225 | 0.445 | 0.330 | Monoclinic | ○ | ○ | 220 |
| Example 34 | Bi | Fe | 1.0 | 0.5 | 0.5 | 0.213 | 0.447 | 0.340 | Monoclinic | ○ | ○ | 220 |
| Example 35 | Bi | Fe | 1.0 | 0.5 | 0.5 | 0.200 | 0.467 | 0.333 | Monoclinic | ○ | ○ | 250 |
| Example 36 | Bi | Fe | 1.0 | 0.5 | 0.5 | 0.180 | 0.504 | 0.316 | Monoclinic | ○ | ○ | 270 |
| Example 37 | Bi | Fe | 1.0 | 0.5 | 0.5 | 0.176 | 0.504 | 0.320 | Monoclinic | ○ | ○ | 270 |
| Example 38 | Bi | Fe | 1.0 | 0.5 | 0.5 | 0.124 | 0.505 | 0.371 | Monoclinic | ○ | ○ | 280 |
| Example 39 | Bi | Fe | 1.0 | 0.5 | 0.5 | 0.122 | 0.526 | 0.352 | Monoclinic | ○ | ○ | 300 |
| Example 40 | Bi | Fe | 1.0 | 0.5 | 0.5 | 0.126 | 0.553 | 0.321 | Monoclinic | ○ | ○ | 240 |
| Example 41 | Bi | Fe | 1.0 | 0.5 | 0.5 | 0.116 | 0.631 | 0.253 | Monoclinic | ○ | ○ | 220 |
| Comparative Example 10 | Bi | Fe | 1.0 | — | 0.5 | 0.000 | 0.661 | 0.339 | Rhombohedral | ○ | ○ | 45 |
| Comparative Example 11 | Bi | Fe | 1.0 | — | 0.5 | 0.000 | 0.744 | 0.256 | Rhombohedral | ○ | ○ | 40 |

TABLE 5

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 42 | Bi | Fe | 1.0 | 0.5 | 0.5 | 0.363 | 0.190 | 0.447 | Tetragonal + monoclinic | ○ | ○ | 110 |
| Example 43 | Bi | Fe | 1.0 | 0.5 | 0.5 | 0.356 | 0.248 | 0.396 | Tetragonal + monoclinic | ○ | ○ | 130 |
| Example 44 | Bi | Fe | 1.0 | 0.5 | 0.5 | 0.338 | 0.302 | 0.360 | Tetragonal + monoclinic | ○ | ○ | 150 |
| Example 45 | Bi | Fe | 1.0 | 0.5 | 0.5 | 0.323 | 0.297 | 0.380 | Tetragonal + monoclinic | ○ | ○ | 170 |
| Example 46 | Bi | Fe | 1.0 | 0.5 | 0.5 | 0.374 | 0.440 | 0.186 | Tetragonal + monoclinic | ○ | ○ | 170 |
| Example 47 | Bi | Fe | 1.0 | 0.5 | 0.5 | 0.256 | 0.326 | 0.418 | Tetragonal + monoclinic | ○ | ○ | 180 |
| Example 48 | Bi | Fe | 1.0 | 0.5 | 0.5 | 0.266 | 0.363 | 0.371 | Tetragonal + monoclinic | ○ | ○ | 190 |
| Example 49 | Bi | Fe | 1.0 | 0.5 | 0.5 | 0.252 | 0.378 | 0.370 | Tetragonal + monoclinic | ○ | ○ | 200 |
| Example 50 | Bi | Fe | 1.0 | 0.5 | 0.5 | 0.247 | 0.393 | 0.360 | Monoclinic | ○ | ○ | 240 |
| Example 51 | Bi | Fe | 1.0 | 0.5 | 0.5 | 0.244 | 0.400 | 0.356 | Monoclinic | ○ | ○ | 290 |
| Example 52 | Bi | Fe | 1.0 | 0.5 | 0.5 | 0.216 | 0.447 | 0.337 | Monoclinic | ○ | ○ | 270 |
| Example 53 | Bi | Fe | 1.0 | 0.5 | 0.5 | 0.201 | 0.446 | 0.353 | Monoclinic | ○ | ○ | 250 |
| Example 54 | Bi | Fe | 1.0 | 0.5 | 0.5 | 0.169 | 0.447 | 0.384 | Monoclinic | ○ | ○ | 240 |
| Example 55 | Bi | Fe | 1.0 | 0.5 | 0.5 | 0.164 | 0.476 | 0.360 | Monoclinic | ○ | ○ | 230 |
| Example 56 | Bi | Fe | 1.0 | 0.5 | 0.5 | 0.160 | 0.489 | 0.351 | Monoclinic | ○ | ○ | 220 |
| Example 57 | Bi | Fe | 1.0 | 0.5 | 0.5 | 0.138 | 0.540 | 0.322 | Monoclinic | ○ | ○ | 220 |
| Comparative Example 12 | Bi | Fe | 1.0 | — | 0.5 | 0.000 | 0.612 | 0.388 | Rhombohedral | ○ | ○ | 40 |
| Comparative Example 13 | Bi | Fe | 1.0 | — | 0.5 | 0.000 | 0.642 | 0.358 | Rhombohedral | ○ | ○ | 50 |

TABLE 6

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 58 | Bi | Fe | 1.0 | 0.5 | 0.4 | 0.282 | 0.261 | 0.457 | Tetragonal + monoclinic | ○ | ○ | 160 |
| Example 59 | Bi 90% La 10% | Fe | 1.0 | 0.5 | 0.5 | 0.215 | 0.352 | 0.433 | Tetragonal + monoclinic | ○ | ○ | 180 |
| Example 60 | Bi 90% La 10% | Fe | 1.1 | 0.5 | 0.5 | 0.224 | 0.369 | 0.407 | Tetragonal + monoclinic | ○ | ○ | 190 |
| Example 61 | Bi | Fe | 1.1 | 0.5 | 0.5 | 0.194 | 0.330 | 0.476 | Tetragonal + monoclinic | ○ | ○ | 190 |
| Example 62 | Bi 90% La 10% | Fe | 1.0 | 0.5 | 0.5 | 0.218 | 0.406 | 0.376 | Tetragonal + monoclinic | ○ | ○ | 220 |
| Example 63 | Bi 90% La 10% | Fe | 1.1 | 0.5 | 0.5 | 0.223 | 0.422 | 0.355 | Tetragonal + monoclinic | ○ | ○ | 220 |
| Example 64 | Bi 95% La 5% | Fe | 1.0 | 0.5 | 0.5 | 0.171 | 0.413 | 0.416 | Monoclinic | ○ | ○ | 260 |
| Example 65 | Bi | Fe | 0.9 | 0.5 | 0.5 | 0.094 | 0.468 | 0.438 | Monoclinic + rhombohedral | ○ | ○ | 210 |
| Comparative Example 14 | Bi | Fe | 1.1 | 0.4 | — | 0.467 | 0.000 | 0.533 | Non-perovskite | x | x | x |

TABLE 7

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 66 | Bi | Fe | 1.0 | 0.5 | 0.5 | 0.350 | 0.380 | 0.270 | Tetragonal + monoclinic | ○ | ○ | 180 |
| Example 67 | Bi | Fe | 1.0 | 0.5 | 0.5 | 0.170 | 0.560 | 0.270 | Monoclinic | ○ | ○ | 280 |
| Example 68 | Bi | Fe | 1.0 | 0.5 | 0.5 | 0.165 | 0.610 | 0.225 | Monoclinic | ○ | ○ | 240 |
| Comparative Example 15 | Bi | Fe | 1.0 | — | 0.5 | 0.000 | 0.780 | 0.220 | Rhombohedral | ○ | ○ | 40 |
| Comparative Example 16 | Bi | Fe | 1.0 | — | 0.5 | 0.000 | 0.730 | 0.270 | Rhombohedral | ○ | ○ | 30 |

TABLE 8

| | A element | M element | x | j | k | l | m | n | Crystal system | Ferroelectricity | Insulation property | Piezoelectric constant d33 (pm/V) |
|---|---|---|---|---|---|---|---|---|---|---|---|---|
| Example 69 | Bi 97% Dy 3% | Fe 99% Sc 0.5% Mn 0.5% | 1.0 | 0.5 | 0.5 | 0.350 | 0.380 | 0.270 | Tetragonal + monoclinic | ○ | ○ | 95 |
| Example 70 | Bi 99% Pr 1% | Fe 99.5% Y 0.5% | 1.0 | 0.5 | 0.5 | 0.170 | 0.560 | 0.270 | Tetragonal + monoclinic | ○ | ○ | 230 |
| Example 71 | Bi | Fe | 1.0 | 0.5 | 0.5 | 0.165 | 0.610 | 0.225 | Monoclinic | ○ | ○ | 240 |
| Example 72 | Bi 95% La 5% | Fe 90% Al 10% | 1.1 | 0.5 | 0.5 | 0.000 | 0.780 | 0.220 | Monoclinic | ○ | ○ | 260 |

Figure 8:
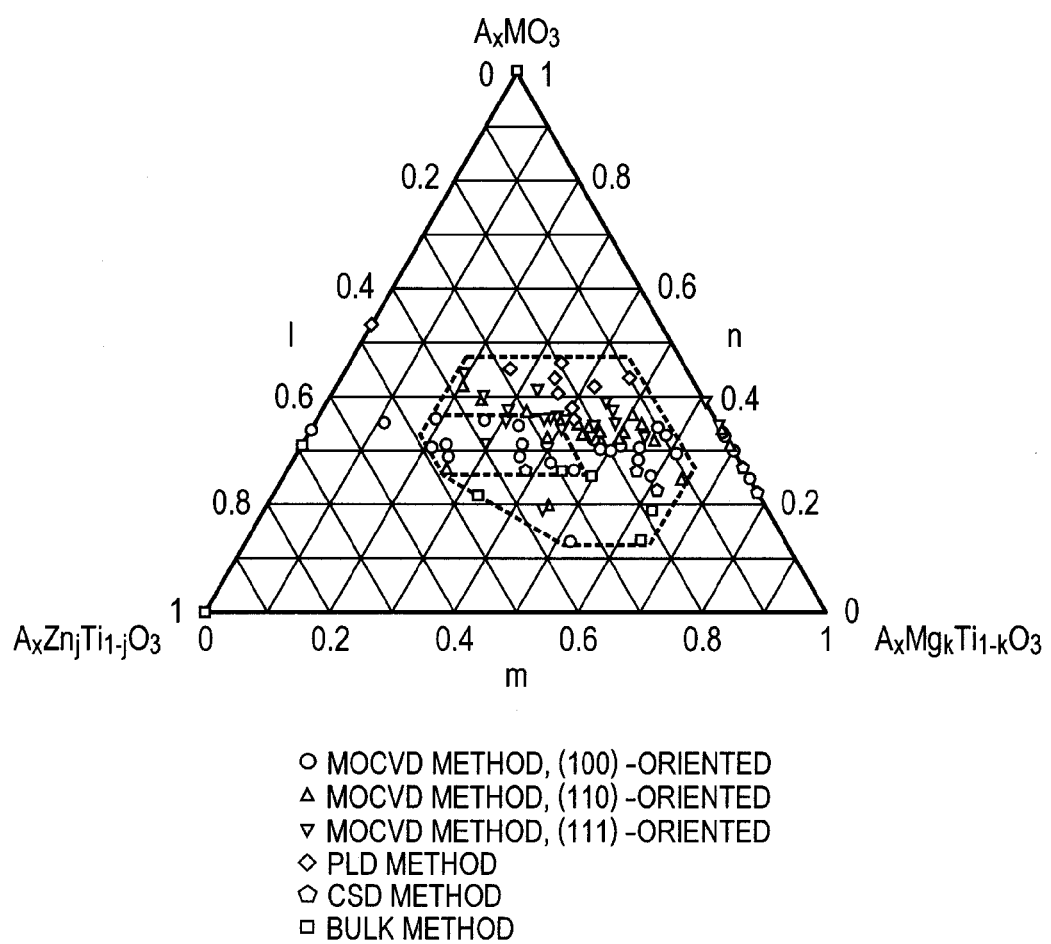
FIG. 8 is a ternary phase diagram illustrating a relationship among the compositions of metal oxides of Examples 1 to 72 of the present invention and Comparative Examples 1 to 16.

FIG. 8 is a ternary phase diagram illustrating a relationship among the compositions of the metal oxides of Examples 1 to 72 of the present invention and Comparative Examples 1 to 16.

FIG. 8, Table 1, Table 2, Table 3, Table 4, Table 5, Table 6, Table 7, and Table 8 suggested that each piezoelectric material of the present invention had high piezoelectricity and was superior in piezoelectricity to the metal oxide of each of the comparative examples.

In addition, although the piezoelectric materials and piezoelectric elements of the present invention were produced by the MOCVD method, the pulse laser deposition method, the chemical solution deposition method, and the conventional bulk production method in Examples 1 to 72 described above, similar piezoelectric materials can be obtained by other methods of producing ceramics and metal oxide thin films.

(Liquid Discharge Heads and Ultrasonic Motors Based on Examples 12, 15, 20, 39, and 51)

Such liquid discharge heads and ultrasonic motors as illustrated in FIGS. 2A and 2B, and FIGS. 3A and 3B were produced by using the same piezoelectric materials as those of Examples 12, 15, 20, 39, and 51. Each liquid discharge head was observed to discharge ink following an input electrical signal. Each ultrasonic motor was observed to show its rotational behavior in accordance with the application of an alternating voltage.

According to the present invention, there can be provided a piezoelectric material free of any component harmful to an environment and having high piezoelectricity. In addition, the present invention can provide a piezoelectric element, a liquid discharge head, and an ultrasonic motor each using the piezoelectric material. The piezoelectric material of the present invention is applicable to an MEMS technology as well, and can find use in instruments using large amounts of ferroelectric materials and piezoelectric materials such as a ferroelectric memory, a ferroelectric sensor, and a piezoelectric transducer without any problem.

This application claims the benefit of Japanese Patent Application Nos. 2010-045908, filed Mar. 2, 2010, 2010-204420, filed Sep. 13, 2010, and 2010-292850, filed Dec. 28, 2010, which are hereby incorporated by reference herein in their entirety.

The invention claimed is:

1. A piezoelectric material, comprising a perovskite-type metal oxide represented by the following general formula (1):

$$A_x(Zn_jTi_{(1-j)})_l(Mg_kTi_{(1-k)})_mM_nO_3 \quad \text{General formula (1)}$$

where:
A represents a Bi element, or one or more kinds of elements selected from the group consisting of trivalent metal elements and containing at least a Bi element;
M represents at least one kind of an element selected from the group consisting of Fe, Al, Sc, Mn, Y, Ga, and Yb; and
$0.9 \leq x \leq 1.25$, $0.4 \leq j \leq 0.6$, $0.4 \leq k \leq 0.6$, $0.27 \leq l \leq 0.49$, $0.19 \leq m \leq 0.46$, $0.27 \leq n \leq 0.36$, and $l+m+n=1$ are satisfied.

2. The piezoelectric material according to claim 1, wherein the A is formed only of a Bi element.

3. The piezoelectric material according to claim 1, wherein the A contains one or more kinds of elements selected from the group consisting of trivalent lanthanoids in addition to a Bi element.

4. The piezoelectric material according to claim 3, wherein the one or more kinds of elements in the A comprise a La element.

5. The piezoelectric material according to claim 3, wherein a ratio of the Bi element to the A is 70 mol % or more and 99.9 mol % or less.

6. The piezoelectric material according to claim 1, wherein the M is formed of at least one, or both, of Fe and Al elements.

7. The piezoelectric material according to claim 6, wherein the M contains 0.1 mol % or more and 5 mol % or less of a Mn element.

8. The piezoelectric material according to claim 1, wherein a crystal system of the perovskite-type metal oxide includes at least a monoclinic structure.

9. The piezoelectric material according to claim 1, wherein a crystal system of the perovskite-type metal oxide includes only a monoclinic structure.

10. The piezoelectric material according to claim 1, wherein the piezoelectric material comprises a film provided on a substrate and having a thickness of 200 nm or more and 10 μm or less.

11. The piezoelectric material according to claim 10, wherein the piezoelectric material is selectively (001) oriented, (110) oriented, or (111) oriented.

12. A piezoelectric element, comprising a piezoelectric material and a pair of electrodes provided in contact with the piezoelectric material, wherein the piezoelectric material comprises the piezoelectric material according to claim 1.

13. The piezoelectric element according to claim 12, wherein the piezoelectric element is provided on a substrate, and the substrate comprises a single-crystal substrate, which is (100) oriented, (110) oriented, (111) oriented.

14. The piezoelectric element according to claim 12, wherein at least one of the pair of electrodes comprises a perovskite-type metal oxide represented by $M1RuO_3$, where M1 represents at least one kind selected from the group consisting of Sr, Ba, and Ca.

15. A liquid discharge head, comprising the piezoelectric element according to claim 12.

16. An ultrasonic motor, comprising the piezoelectric element according to claim 12.

17. A piezoelectric material, comprising a perovskite-type metal oxide represented by the following general formula (1):

$$A_x(Zn_jTi_{(1-j)})_l(Mg_kTi_{(1-k)})_mM_nO_3 \quad \text{General formula (1)}$$

where:
A represents a Bi element, or one or more kinds of elements selected from the group consisting of trivalent metal elements and containing at least a Bi element;
M represents at least one kind of an element selected from the group consisting of Fe, Al, Sc, Mn, Y, Ga, and Yb;
$0.9 \leq x \leq 1.25$, $0.4 \leq j \leq 0.6$, and $0.4 \leq k \leq 0.6$ are satisfied; and
$l+m+n=1$ is satisfied, and, l, m, and n fall within a range surrounded by coordinate points A, B, C, D, E, F, G, H, I, and A, provided that the coordinate points A, B, C, and D, a line connecting the coordinate points A and B, a line connecting the coordinate points B and C, and a line connecting the coordinate points C and D are excluded from the range:
A: (l, m, n)=(0.45, 0.19, 0.36);
B: (l, m, n)=(0.27, 0.37, 0.36);
C: (l, m, n)=(0.27, 0.46, 0.27);
D: (l, m, n)=(0.49, 0.24, 0.27);
E: (l, m, n)=(0.35, 0.52, 0.13);
F: (l, m, n)=(0.23, 0.64, 0.13);
G: (l, m, n)=(0.09, 0.64, 0.27);
H: (l, m, n)=(0.09, 0.43, 0.48); and
I: (l, m, n)=(0.33, 0.19, 0.48).

* * * * *